(12) United States Patent
McGowan et al.

(10) Patent No.: US 10,390,399 B2
(45) Date of Patent: Aug. 20, 2019

(54) LED ASSEMBLY HAVING BASE INSERT MOLDED ABOUT TERMINALS AND SUBSTRATE WITH A PLURALITY OF LED CHIPS POSITIONED ON SAID SUBSTRATE

(71) Applicant: Molex, LLC, Lisle, IL (US)

(72) Inventors: Daniel B. McGowan, Glen Ellyn, IL (US); Victor Zaderej, Wheaton, IL (US); Michael C. Picini, Aurora, IL (US)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 14/759,827

(22) PCT Filed: Jan. 10, 2014

(86) PCT No.: PCT/US2014/011079
§ 371 (c)(1),
(2) Date: Jul. 8, 2015

(87) PCT Pub. No.: WO2014/110396
PCT Pub. Date: Jul. 17, 2014

(65) Prior Publication Data
US 2015/0338081 A1    Nov. 26, 2015

Related U.S. Application Data

(60) Provisional application No. 61/751,234, filed on Jan. 10, 2013, provisional application No. 61/751,329, filed on Jan. 11, 2013.

(51) Int. Cl.
*H05B 33/08*    (2006.01)
*F21V 23/00*    (2015.01)
(Continued)

(52) U.S. Cl.
CPC ........... *H05B 33/0845* (2013.01); *F21K 9/20* (2016.08); *F21V 23/005* (2013.01); *F21V 23/06* (2013.01);
(Continued)

(58) Field of Classification Search
CPC .......... F21K 9/175; F21K 9/30; F21V 23/001; F21V 23/002; F21V 23/003;
(Continued)

(56) References Cited

U.S. PATENT DOCUMENTS 5,471,023 A * 11/1995 Kaizu ................ H01H 13/702
200/292
5,635,115 A * 6/1997 Konishi ................ G02B 3/005
257/E21.502

(Continued)

FOREIGN PATENT DOCUMENTS

| JP | 2003-059332 A | 2/2003 |
| JP | 2006-332618 A | 12/2006 |

(Continued)

*Primary Examiner* — Robert J May
(74) *Attorney, Agent, or Firm* — Molex, LLC

(57) ABSTRACT

An LED assembly is disclosed that comprises a based formed around terminals and a substrate. An LED array is positioned on the substrate in a recess. The LED array is electrically coupled to the terminals, which may be part of a connector formed in the base. An emission disk can be positioned over the LED array. If desired, circuitry can be supplied on the base that helps control or condition the supplied power.

15 Claims, 35 Drawing Sheets

(51) Int. Cl.
*F21V 23/06* (2006.01)
*F21K 9/20* (2016.01)
*F21Y 105/10* (2016.01)
*F21Y 115/10* (2016.01)

(52) U.S. Cl.
CPC ....... *F21Y 2105/10* (2016.08); *F21Y 2115/10* (2016.08); *H01L 2224/45144* (2013.01); *H01L 2224/48091* (2013.01); *H01L 2224/48137* (2013.01)

(58) Field of Classification Search
CPC ...... F21V 23/004; F21V 23/005; F21V 23/06; F21Y 2105/001; F21Y 2101/02; F21Y 2105/10; H01L 2224/48091; H01L 2224/48137; H01L 2924/00014; H01L 2224/45144; H01L 2924/00; H01L 33/62; H01L 2224/04042; H01L 2224/05552; H01L 2224/48227; H01L 2224/48237; H01L 2224/40137; H01L 2224/45015; H01L 2224/85
See application file for complete search history.

(56) References Cited

U.S. PATENT DOCUMENTS

| | | | |
|---|---|---|---|
| 6,503,780 B1* | 1/2003 | Glenn | H01L 27/14618 438/106 |
| 7,129,572 B2* | 10/2006 | Wang | H01L 23/13 257/686 |
| 7,618,156 B2* | 11/2009 | Yoneda | F21V 7/0091 362/202 |
| 8,727,568 B2 | 5/2014 | Oyaizu et al. | |
| 8,783,911 B2* | 7/2014 | Wu | F21K 9/30 362/249.02 |
| 9,052,104 B2 | 6/2015 | Watanabe et al. | |
| 9,099,616 B2* | 8/2015 | Andrews | H01L 24/85 |
| 9,163,790 B2 | 10/2015 | Ogata et al. | |
| 9,300,062 B2* | 3/2016 | Hussell | H01L 25/0753 |
| 2002/0071279 A1* | 6/2002 | Katogi | H05B 33/0863 362/317 |
| 2003/0218417 A1* | 11/2003 | Chin | H05K 5/0017 313/498 |
| 2005/0058388 A1* | 3/2005 | Nomura | G02B 6/4201 385/14 |
| 2007/0295975 A1* | 12/2007 | Omae | H01L 25/167 257/89 |
| 2009/0294780 A1* | 12/2009 | Chou | H05B 33/12 257/88 |
| 2011/0260181 A1 | 10/2011 | Siegmund et al. | |
| 2012/0018764 A1* | 1/2012 | Choi | H01L 33/54 257/99 |
| 2012/0088397 A1* | 4/2012 | Lee | B29C 45/0001 439/487 |
| 2012/0126255 A1* | 5/2012 | Hussell | H01L 25/0753 257/88 |
| 2012/0175643 A1* | 7/2012 | West | H01L 33/62 257/88 |
| 2012/0175653 A1 | 7/2012 | West | |
| 2012/0294017 A1 | 11/2012 | Nagasaki et al. | |
| 2013/0038644 A1* | 2/2013 | Chan | H01L 33/62 345/690 |
| 2013/0119431 A1* | 5/2013 | Suzuki | H01L 33/52 257/100 |
| 2013/0176732 A1 | 7/2013 | McGowan et al. | |

FOREIGN PATENT DOCUMENTS

| | | |
|---|---|---|
| JP | 2008-518384 A | 5/2008 |
| JP | 2011-044741 A | 3/2011 |
| JP | 2012-038624 A | 2/2012 |
| JP | 2014-127560 A | 7/2014 |
| TW | 201246637 A | 11/2012 |
| WO | WO 2011-052639 A1 | 5/2011 |
| WO | WO 2012-148585 A1 | 11/2012 |

* cited by examiner

LED ASSEMBLY HAVING BASE INSERT MOLDED ABOUT TERMINALS AND SUBSTRATE WITH A PLURALITY OF LED CHIPS POSITIONED ON SAID SUBSTRATE

RELATED APPLICATIONS

This application claims priority to U.S. Application Ser. No. 61/751,234, filed Jan. 10, 2013, and to U.S. Application Ser. No. 61/751,329, filed Jan. 11, 2013, both of which are incorporated herein by reference in their entirety.

FIELD OF THE INVENTION

The present invention relates to field of LED holders.

DESCRIPTION OF RELATED ART

Light emitting diode (LED) technology has the potential to dramatically change the way illumination is provided. LEDs are very compact and can be provided in form factors that conventional light sources are unable to match. LEDs, however, are still somewhat expensive compared to other types of light sources and have certain issues that must be addressed in order for the LED to function desirably. For example, LEDs are efficient and don't generate as much heat as incandescent light sources but ironically are much more sensitive to heat and thus require more care to ensure their junction temperature is kept at a reasonable level. One potentially desirable manner to provide LEDs that helps address the above issue is to use chip on board (COB) technology to create an LED array that offers good light extraction and desirable thermal dissipation. FIG. 1 illustrates a LED chip 10 (herein after a LED chip will be referred to as a chip for ease of discussion) that has a COB design. The chip 10 includes a p-type material and an n-type material that are coupled to an anode and cathode, respectively, and form a p-n junction that emits light when power is applied to the chip 10. Naturally, there are a number of different configurations of COB style chips and the selection of a particular design will depend on the features desired. Typically for COB style chips a wire bond 12, 14 is used to connect to the p-type and n-type material. Wire bonds can be provided as desired and are well known in the industry, typically gold wire bonds are most suitable for such applications but the type of wire bond will depend on the desired properties. As FIG. 2 illustrates, a plurality of chips 10-10c can be connected in series and placed on a substrate 22 (which can be a metal such as aluminum or a ceramic material or metal core PCB or any other desirable material). The design of the substrate naturally depends, in part, on the design of the chip and the method of placing the chip on the substrate. For example, if a chip is placed on a polished aluminum substrate then a thermally conductive and electrically insulative adhesive can be used to secure the chip in place, as is known in the art. An LED array using COB technology can thus provide a system that has good thermal transfer properties and high lumen output due to the number of chips positioned on the substrate.

While the LED array provides a number of advantages, the increase in LED performance has allowed manufactures to reduce the size of the LED array while still providing desirable lumen output. The new smaller LED arrays thus tend to be more difficult to handle. Holders have been provided that can help bridge the gap between the LED array and the electrical and physical connections that position and power the LED array in use. A holder, for example, can be used to secure the LED array in place and can also include contacts that electrically connect terminals to the anode and cathode of the LED array. U.S. application Ser. No. 13/733,998, for example, discloses an embodiment where a holder can be soldered to an LED array so as to provide a one-piece holder and LED array (e.g., an LED assembly) and this application is incorporated herein by reference in its entirety. While this is a desirable outcome, it would be desirable to further reduce the cost of the LED assembly. Thus, certain individuals would appreciate further improvements in LED assemblies.

BRIEF SUMMARY

An LED assembly is disclosed that provides a holder and LED array that are insert molded into a one-piece construction. In an embodiment, the LED assembly can be manufactured in a reel-to-reel operation that reduces costs. The LED assembly can include terminals and a substrate that are formed inside a base. An LED array is provided on the substrate and chips of the LED array are electrically connected to an anode and cathode with wire bonds. An emission disk can be arranged over the chips. Various electrical additional components can be added as desired.

BRIEF DESCRIPTION OF THE DRAWINGS

The present invention is illustrated by way of example and not limited in the accompanying figures in which like reference numerals indicate similar elements and in which:

FIG. 26 illustrates a perspective view of another embodiment of an LED assembly formed similarly to the LED assembly depicted in FIG. 26.

DETAILED DESCRIPTION

Figure 1A:
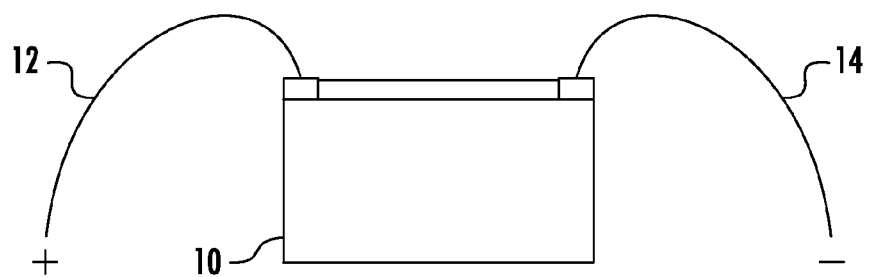
FIG. 1A-1B illustrate COB LEDs as used in existing applications.
Figure 1B:
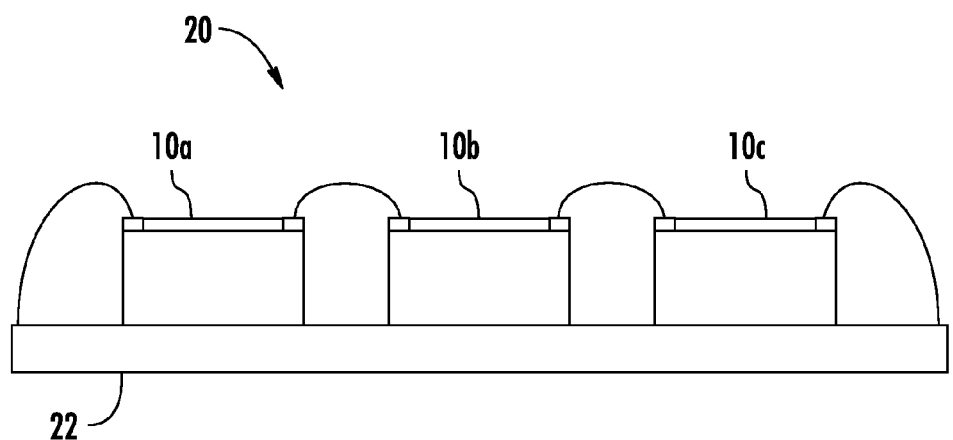

The detailed description that follows describes exemplary embodiments and is not intended to be limited to the expressly disclosed combination(s). As can be appreciated, a number of different features are disclosed and many of the features are alternatives of other depicted features. Therefore, unless otherwise noted, various features disclosed herein may be combined together to form additional combinations that were not otherwise shown for purposes of brevity.

FIGS. 2A-11 illustrate features that can be used together to form a desired LED configuration. T2A-2B illustrate an embodiment of an LED assembly 50 that includes a base 60 with apertures 53 that can be used to secure the LED assembly 50 to a heat sink or other support surface. The base 60 supports insert-molded terminals that include solder pads 51, 52 and further help define a connector 55 formed into the base 60. An emission disk 70 is provided in a recess 62 and can include silicon to help protect the chips and may further include phosphor, or other light converting structures such as nano dots, to help convert light emitted from the chips into a more desirable spectrum. The emission disk 70 can be formed by pouring a slurry into the recess and can be multiple layers. Alternatively the emission disk 70 can be a component that is inserted into the recess and can be formed separately. An LED array 75 is provided in the recess 62 and the chips that form the LED array 75 are connected together in a desired pattern with wire bonds 77 and connected to contact pads, such as contact pad 79a. The base can be a desirable resin and can provide an integrated connector (as depicted) if desired. Solder pads can be provided to electrically couple wires to the LED assembly via a soldering operation. As can be appreciated, either the solder pads or the integrated connector can be omitted or positioned in different locations (or faces of the base). Fastener apertures in the base can be used to secure the LED assembly in position.

As noted above, the emission disk 75 can be a separate disk that is positioned in the recess 62. In other embodiments the emission disk 75 can be a phosphor-containing slurry that is deposited on the array of chips in one or more layers (e.g., one or more layers may be deposited as a slurry into the recess 62 and then allowed to harden). In either case, a silicon layer can first be positioned directly on the chips so as to protect the chips and the wire bonds that are used to electrically connect the chips together (if the array is configured to provide a number of chips in series). As can be appreciated, wire bonds 77 can also connect one or more chips to a contact pads that form the corresponding cathode and anode.

Figure 2A:
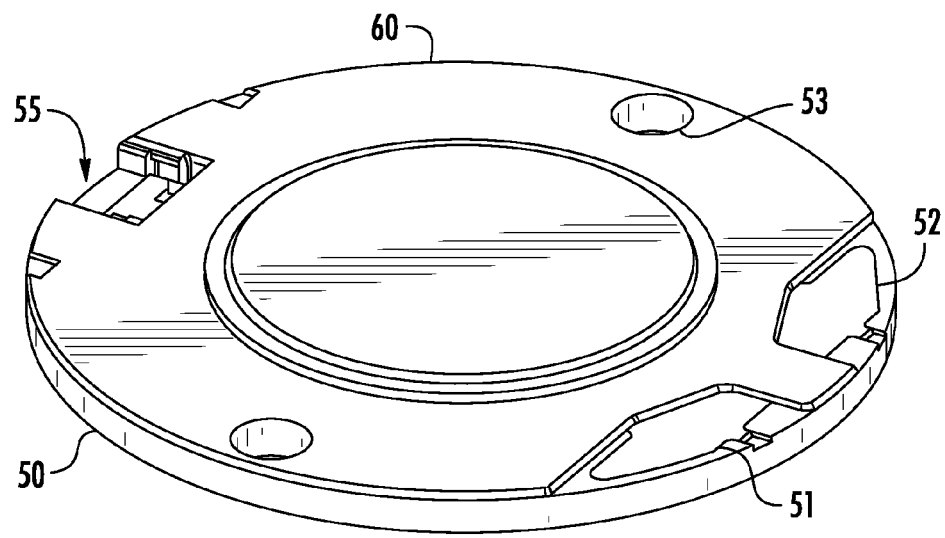
FIG. 2A illustrates a perspective view of an embodiment of an LED assembly.
Figure 2B:
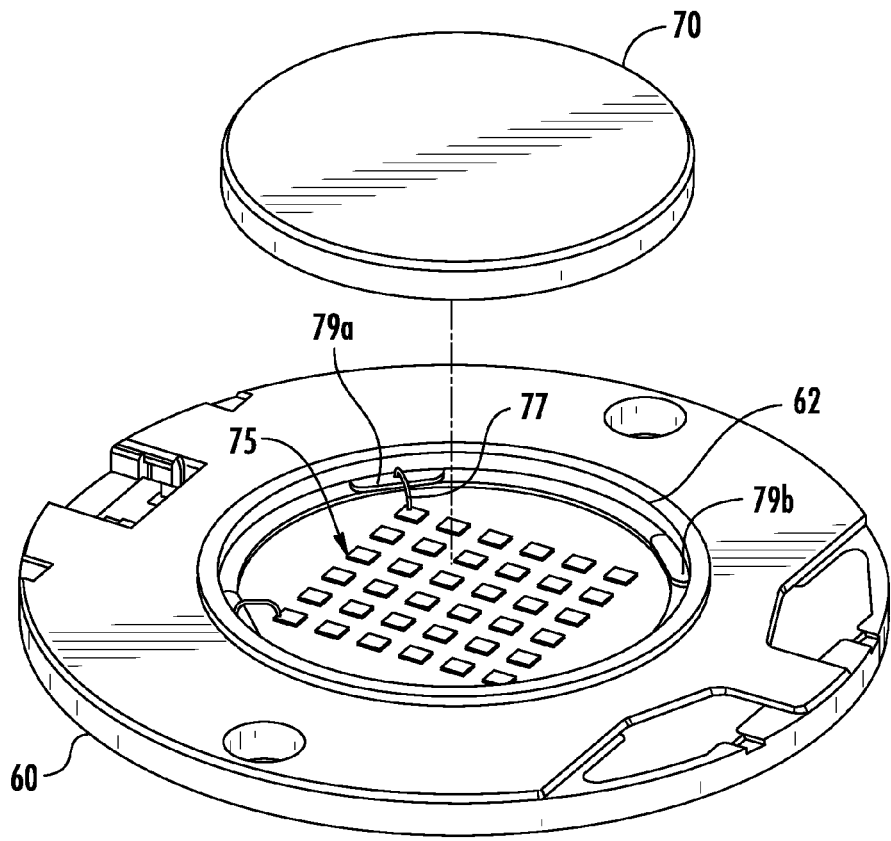
FIG. 2B illustrates a partially exploded and simplified perspective view of the embodiment depicted in FIG. 2A.
Figure 3:
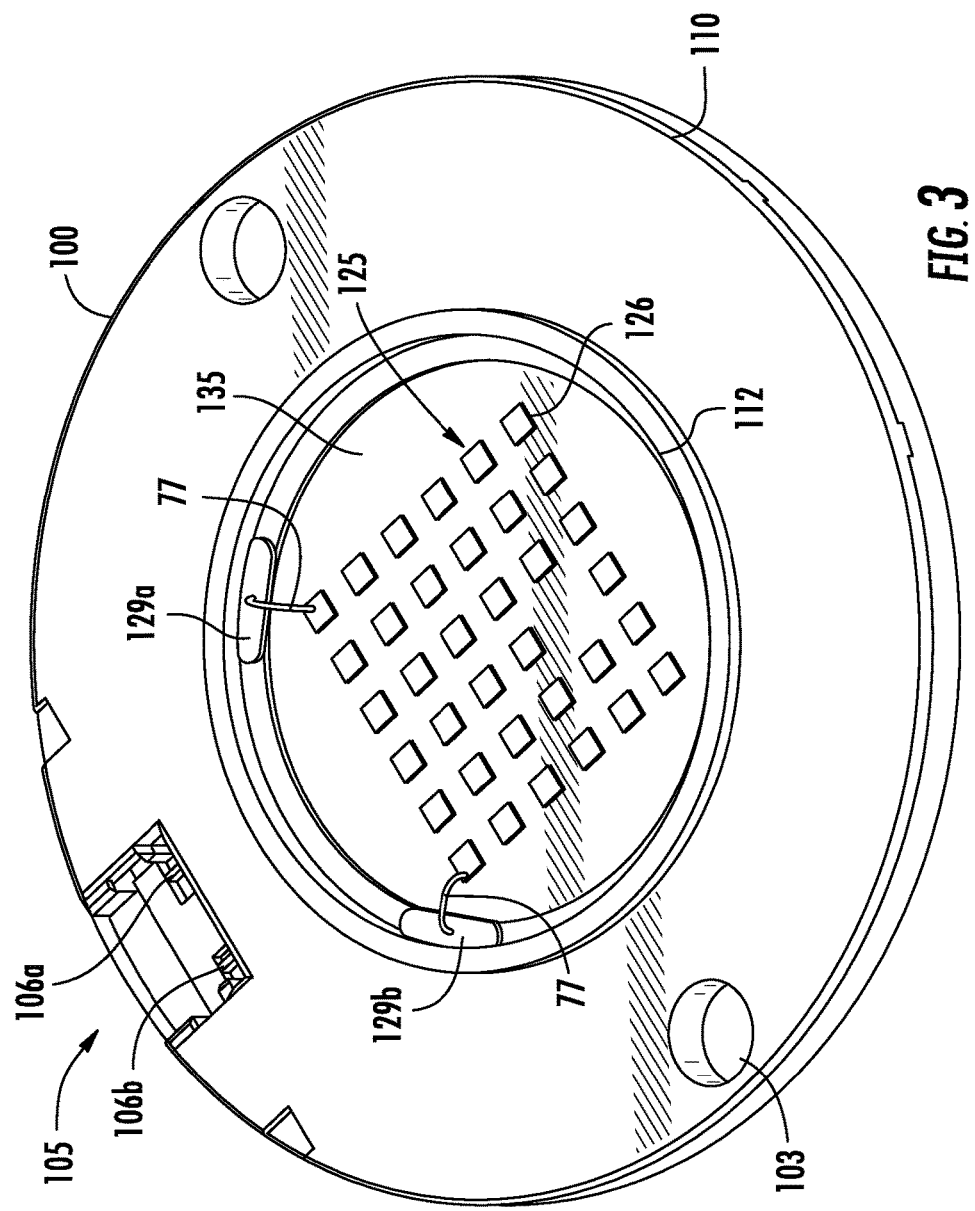
FIG. 3 illustrates a simplified perspective view of an embodiment of an LED assembly.

FIG. 3 illustrates an LED assembly 100 with a base 110 that includes a connector 105 formed in the base 110 and can be formed similarly to the embodiment depicted in FIG. 2A-2B. The connector 105 includes terminals 106a, 106b that are electrically coupled (preferably connected) to contact pads 129a, 129b respectively. A recess 112 in the base 110 is provided and an LED array 125 is provided therein. Wire bonds 77 then connect the contact pads to the LED array 125. It should be noted that chips 126 that form the LED array 125 can be connected in a desirable pattern with wire bonds 77. To simply the illustration the wire bonds between each LED are not shown but in practice a wire bond would connect the chips together in the desired electrical pattern. Thus, as can be appreciated, any desirable pattern of chips could be provided, depending on the forward voltage that the LED assembly was intended to provide, including parallel, serial, and combinations of parallel and serial arrangements can be provided. Naturally, increasing the number of parallel paths of chips also has the benefit of providing addition redundancy.

The base 110 further includes apertures 103 to help secure the LED assembly 100 in place. To provide a mounting place for the LED array 125, a substrate 135 is provided. The substrate 135 can be formed of a separate plate, which can be highly thermally conductive, that is insert-molded into the base 110.

Figure 4:
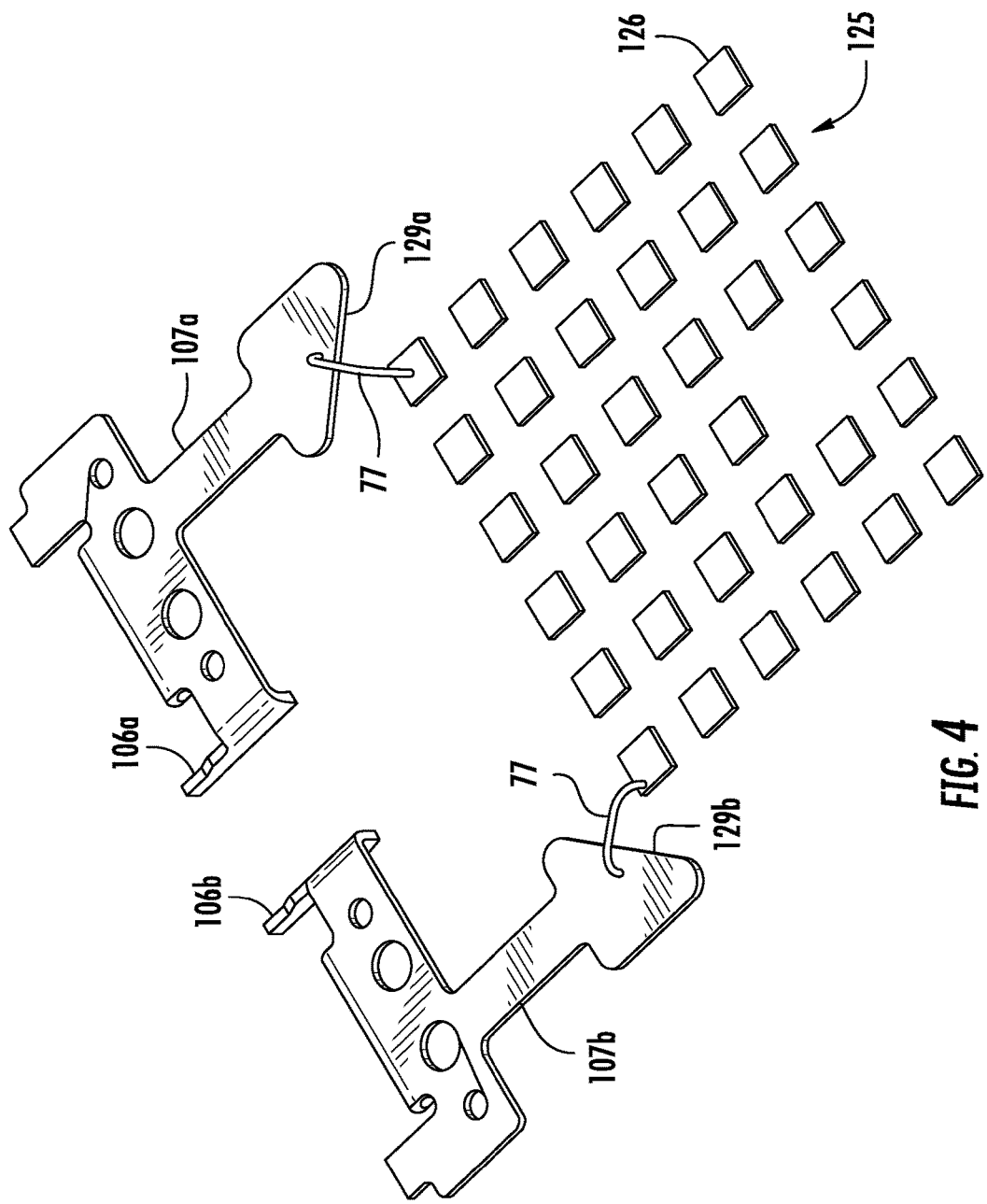
FIG. 4 illustrates a perspective view of an LED array and a corresponding terminals suitable for use in an LED assembly.
Figure 5:
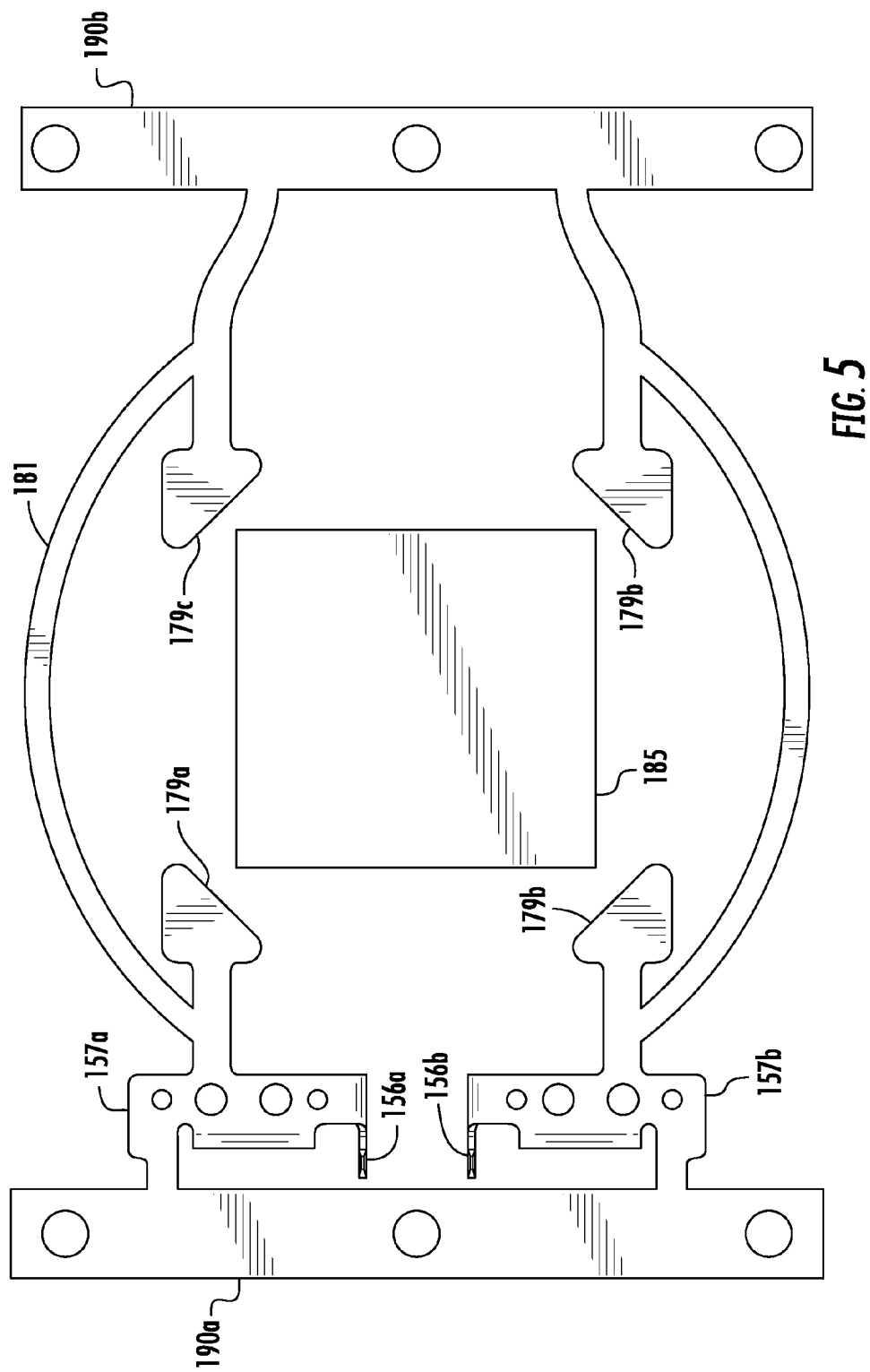
FIG. 5 illustrates a top view of an embodiment of a carrier strip and a heat spreader.

FIG. 4 illustrates a potential arrangement that can be used in a LED assembly such as the LED assembly 100. Terminals 107a, 107b are insert-molded into the base such that contacts 106a, 106b are exposed in the connector 105 while contact pads 129a, 129b are partially exposed in the recess 112. Then wire bonds 77 can connect the contact pads to the LED array 125 and each chip 126 can be connected in the desired electrical pattern.

To provide the LED assembly, one potential configuration is to have a carrier with strips 190a, 190b that support terminals 157a, 157b and electrical bridge 181 can connect contact pads that are supposed to be electrically connected together. Thus, contact pad 179a and 179c are in electrical communication while contact pads 179b, 179d are in electrical communication. The terminal 157a includes a contact 156a and the terminal 157b includes a contact 156b. A substrate 185 can be provided prior to molding the base around the terminals and the substrate in an insert-molding operation. As can be appreciated, the insert molding operation permanently attaches the base to the terminals and the substrate without the need to use additional fasteners or adhesives. Once the carrier is no longer needed the strips can be separated from the LED assembly and the resultant LED assembly can be further process and/or packaged as desired. In certain configurations the final LED assembly could be left on a reel so as to allow for delivery of LED assemblies in reels.

Figure 6:
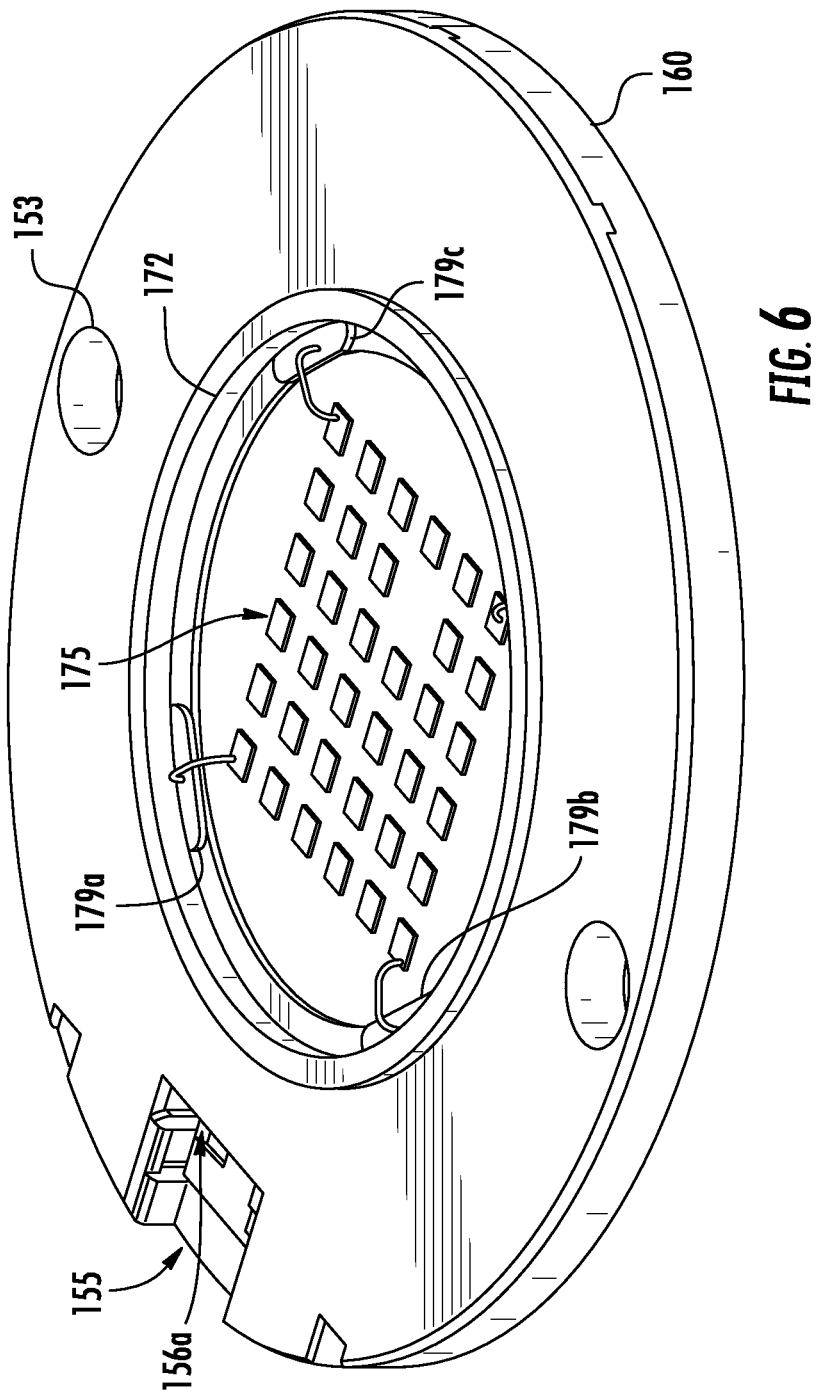
FIG. 6 illustrates a perspective view of another embodiment of an LED assembly.

FIG. 6 illustrates another embodiment of a partially formed LED assembly (the emission disk is omitted for the purpose of illustration). A base 110 has a aperture 153 and includes a connector 155 formed therein (the connector 155 including two or more contacts such as contact 156a) includes a recess 172 and an LED array 175 is positioned in the recess. The LED array 175 is in electrical communication with contact pads 179a, 179b, 179c (and a fourth contact pad not show) via wire bonds.

Figure 7A:
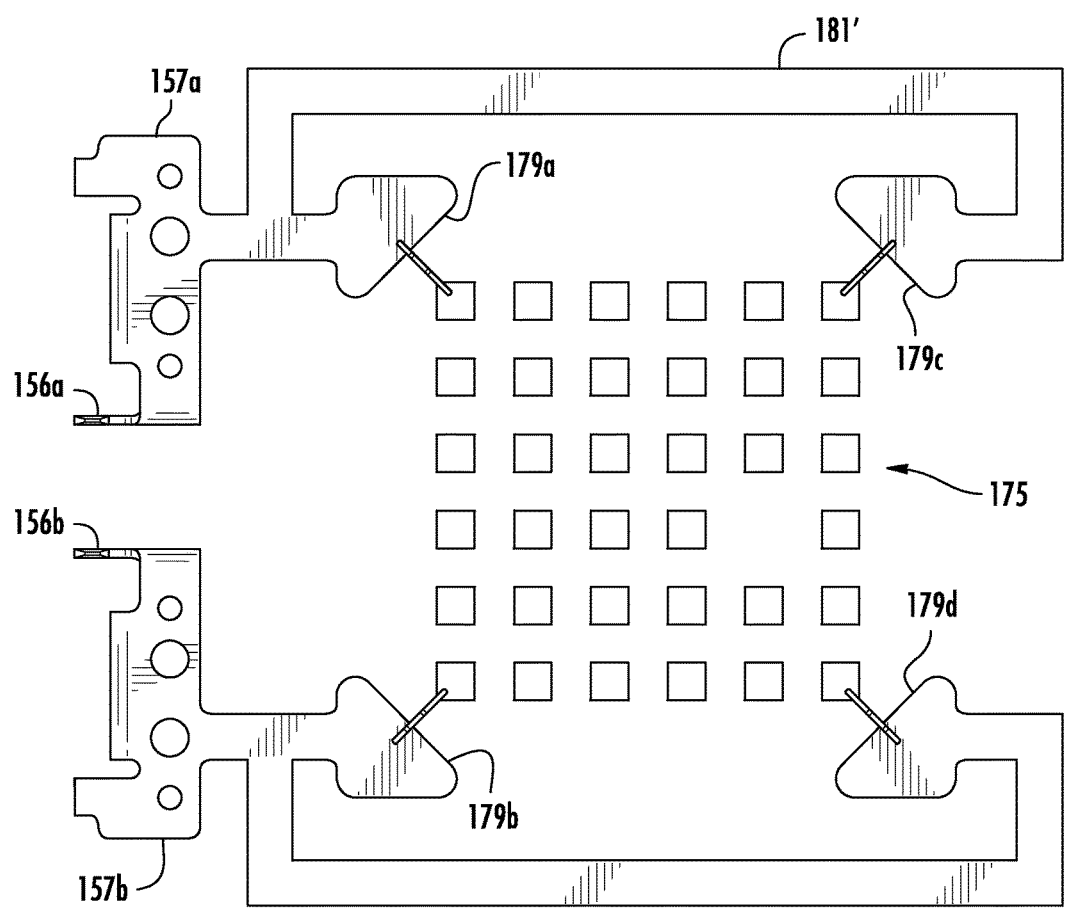
FIG. 7A illustrates a top view of an embodiment of terminals and a corresponding LED array suitable for use in an LED assembly.

FIG. 7A illustrates an embodiment of arrangement that could be used in a LED assembly similar to that depicted in FIG. 6. The terminal 157a includes the contact 156a and two contact pads 179a, 179c that are connected by bridge 181'. The terminal 157b includes contact 156b and contact pads 179b and 179d connected by a bridge. The pads are then connected to an LED array 175 so as to provide the desired electrical pattern. It should be noted that the bridge can take any desired form but preferably will be configured so as to be positioned inside the base when the base is formed.

Figure 7B:
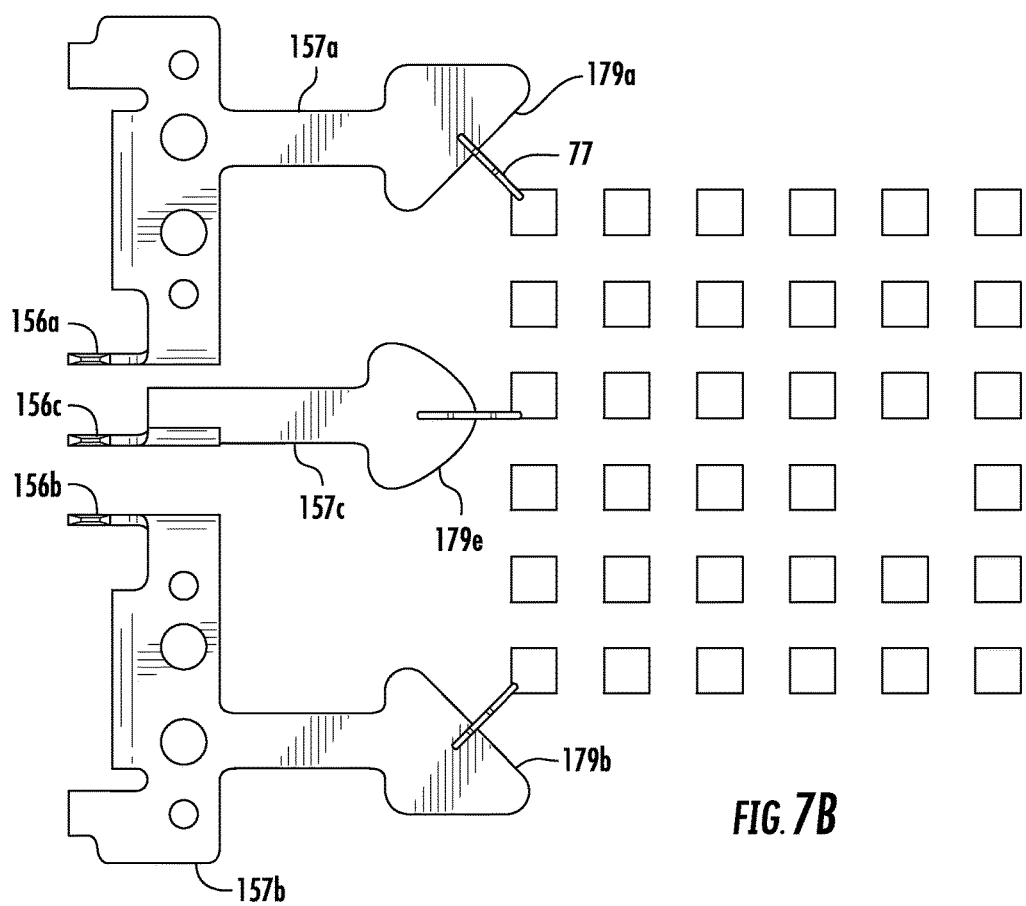
FIG. 7B illustrates a top view another embodiment of terminals and a corresponding LED array suitable for use in an LED assembly.

FIG. 7B illustrates another arrangement with terminals 157a, 157b and 157c. Each terminal 157a, 157b and 157c includes a contact 156a, 156b, 156c and contact pad 179a, 179b, 179c, respectively. The contact pads can then be connected to the associated LED array so as to provide the desired electrical pattern. Thus, while two contacts are suitable for many cases, additional terminals and contacts can be added as desired.

Figure 8:
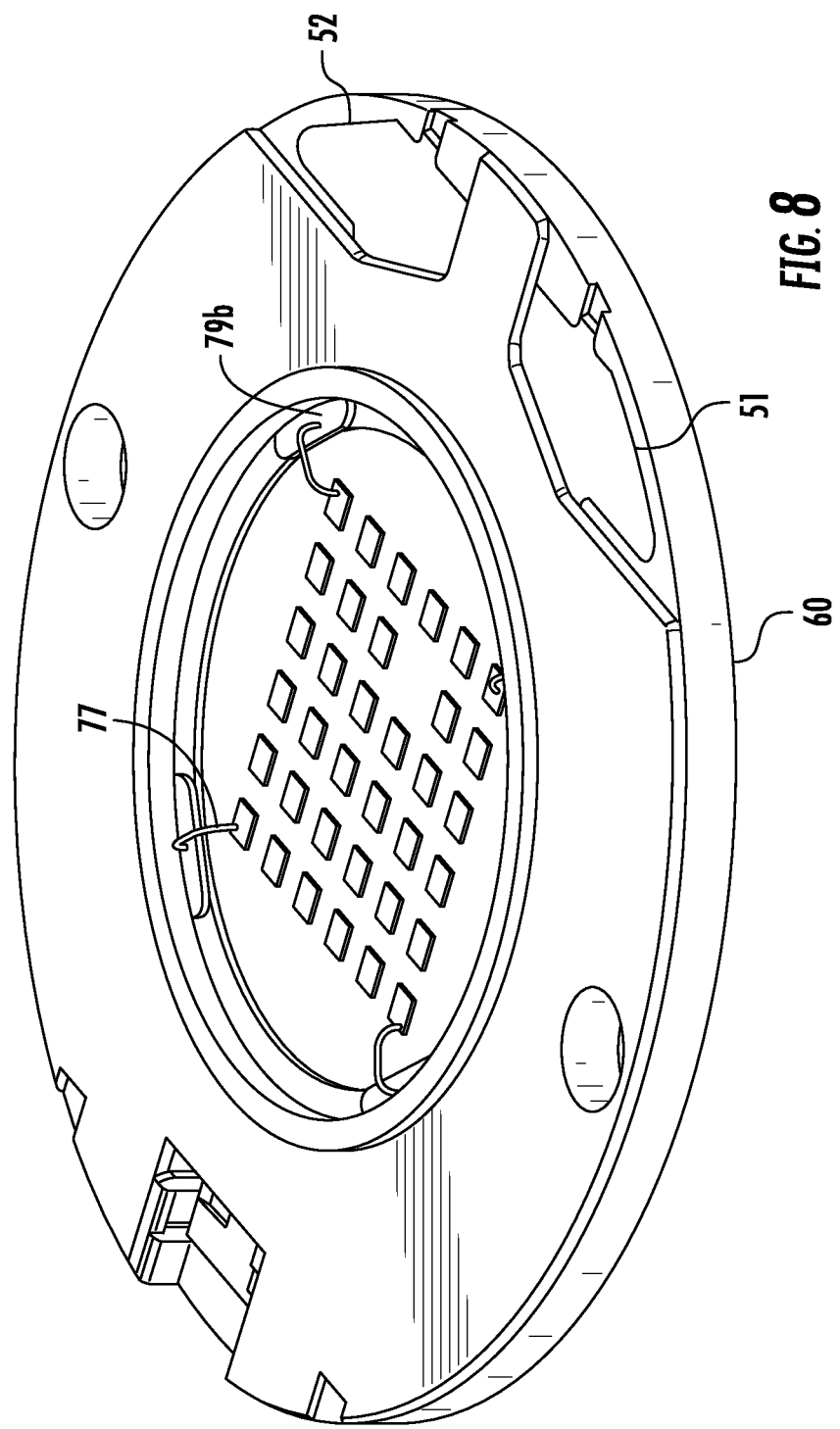
FIG. 8 illustrates a perspective view of another embodiment of an LED assembly.
Figure 9:
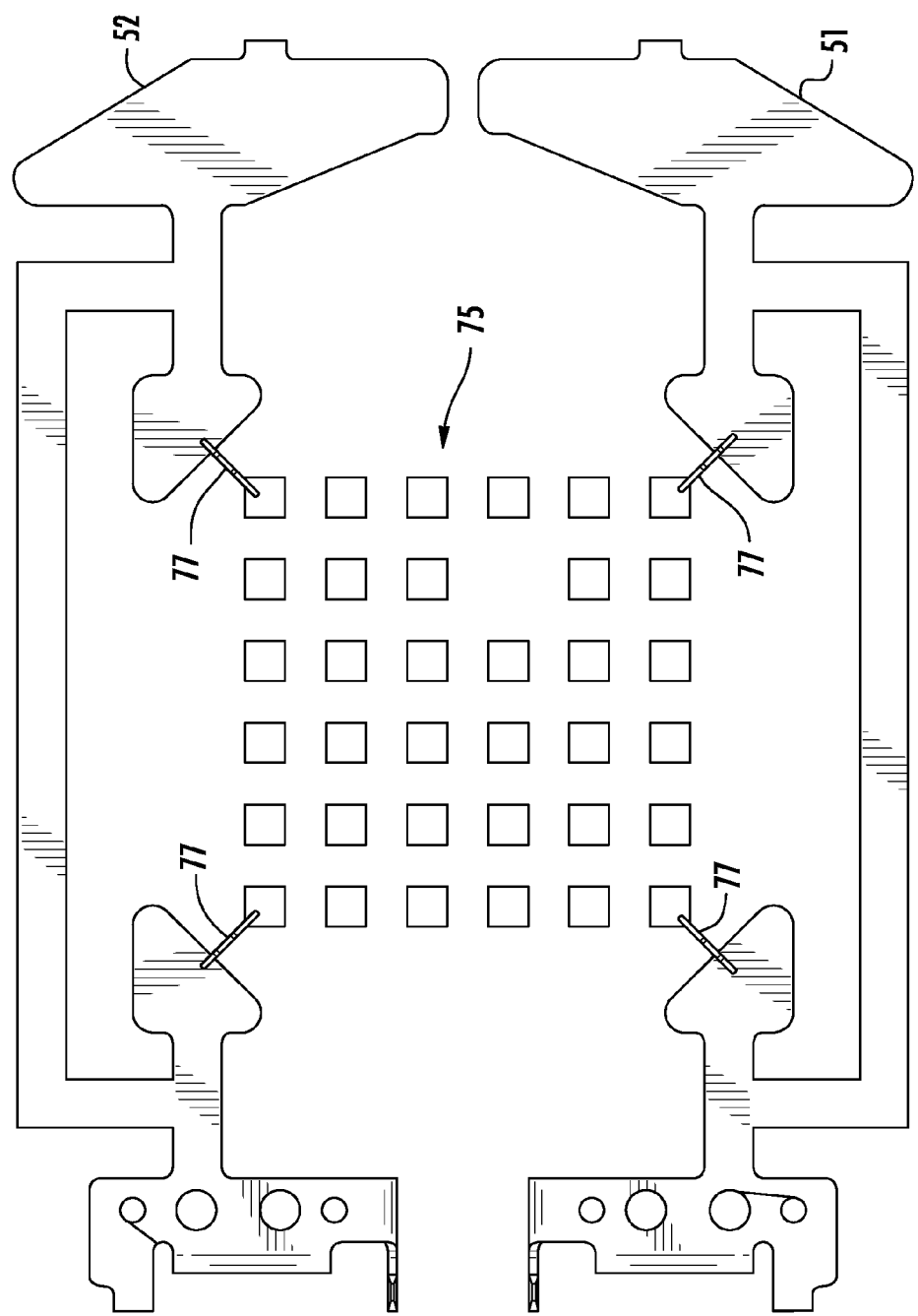
FIG. 9 illustrates an embodiment of terminals and a corresponding LED array suitable for use in the LED assembly depicted in FIG. 8.

FIG. 8 illustrates an embodiment of an LED assembly that includes four contact pads connected to the LED array via wire bonds 77 and also include solder pads 51, 52. FIG. 9 illustrates an arrangement that could be used in such an LED assembly and illustrates four wire bonds 77 from the terminals to the LED array 75.

Figure 10:
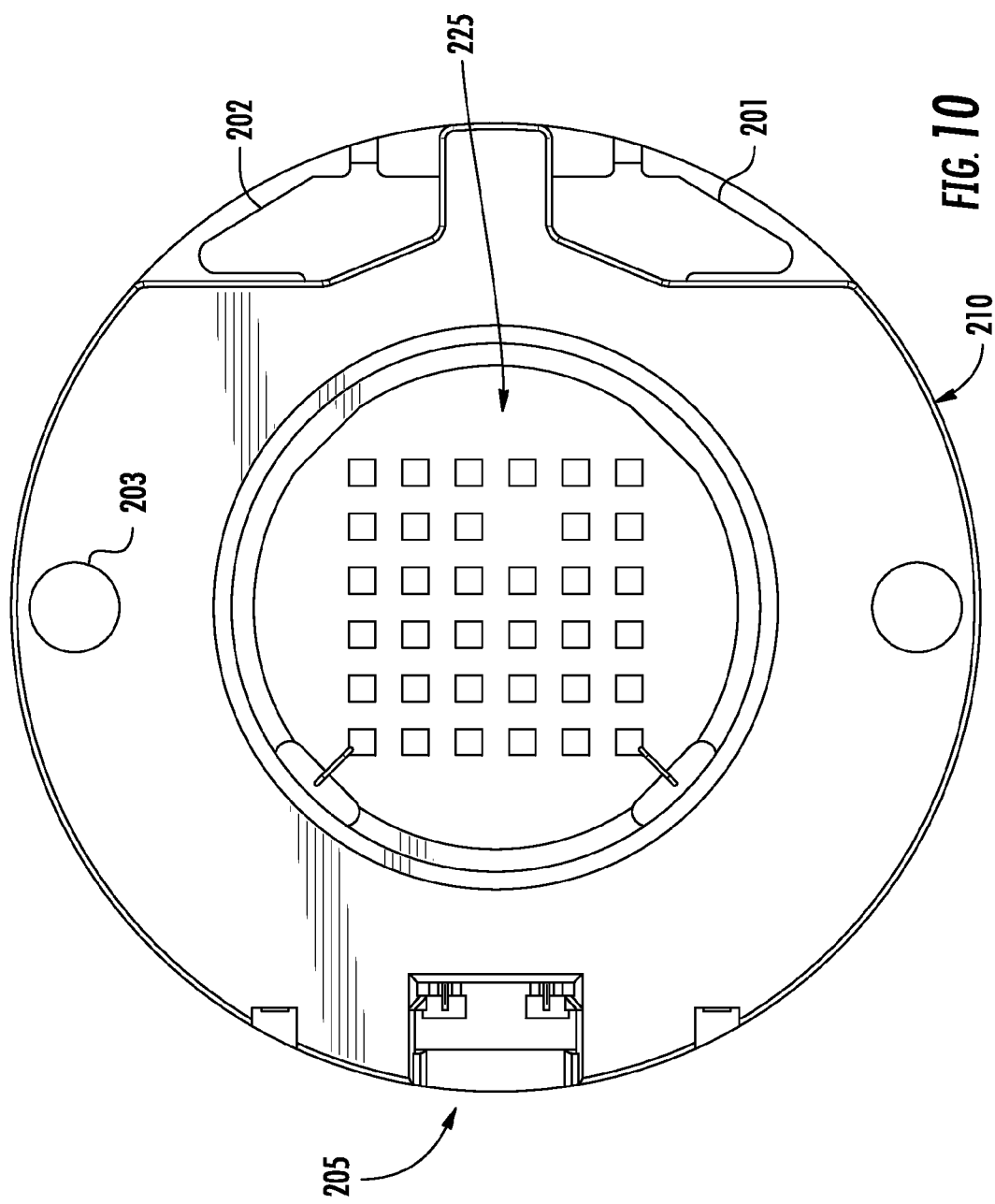
FIG. 10 illustrates a top view of another embodiment of an LED assembly.
Figure 11:
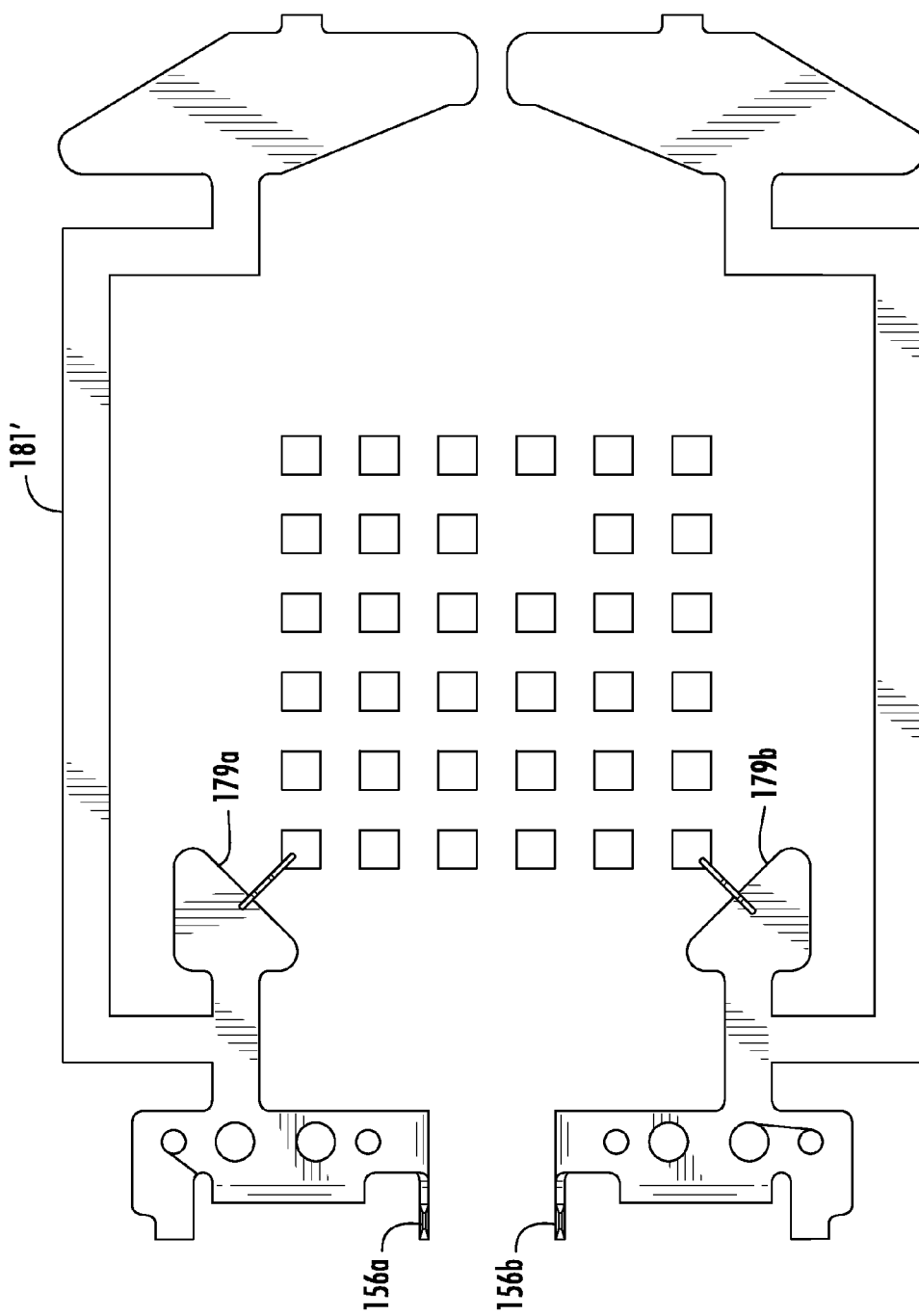
FIG. 11 illustrates an embodiment of terminals and a corresponding LED array suitable for use in the LED assembly depicted in FIG. 10.

Naturally, as can be appreciated from FIGS. 10-11, an embodiment of an LED assembly with a base 210 that includes apertures 203 and a connector 205 with contacts 156a, 156b could be provided with solder pads 201, 202 and an LED array that is only connected to two contact pads 179a, 179b. The solder pads could be connected to the contact pads via a bridge 181'.

Thus, the depicted embodiments can be adjusted and modified by adding and removing the various figures to create the desired configuration of an LED assembly.

It should be noted that if more than two electrical contacts are provided (e.g., FIG. 7B) then additional circuit configurations are possible. For example, 2 or more anode contacts could be provided and the power being applied to each anode contact could be controlled separately so that was possible to adjust power to the different strings of LED separately. As can be appreciated, this could provide an LED assembly that could readily provide different levels of lumen output (in addition to possible dimming that could take place). The number of contacts is only limited by the size of the integrated contact and thus a system with four or more terminals could readily be provided. As can be appreciated, the ability to have two or more contacts is beneficial feature of the integrated connector.

As can be appreciated, apertures can be included in the base to provide points of attachment. Alternatively the LED assemblies can be configured to be mounted into a system that clamps down on one or more surfaces and/or edges of the LED assembly. Thus a variety of configurations are possible with respect to the base. The base can also include polarizing features to ensure the base is mounted in a desired orientation. Thus, the depicted circular shape is merely representative of one of a nearly infinite number of shape variations and is not intended to be limiting unless otherwise noted. For example, the LED assembly could be shaped so as to be comparable to a star package or a ZHAGA defined size.

As depicted, the LED assembly can be constructed with an insert molding process. For example, a carrier can support terminals that are positioned in a mold. A substrate can be positioned on the mold and then the resin is inserted into the mold to form an integrated assembly that includes a base, a substrate and terminals.

An LED assembly 300, for example, can include integrated controls and components. A base 310 includes optional apertures 305 and is depicted as including both an integrated connector 305 and solder pads 301, 302 but if desired one of the connections could be omitted. Circuitry 308, which can include controllers, drivers, capacitors, transceivers and any other desirable electrical components. As can be appreciated, the particular electrical components that might be desirable to add to a LED assembly depend on the configuration and intended use. Certain applications might be powered by AC power, others by DC power. The use of controllers/driver to convert input power to the desirable output power is well known and thus will not be discussed herein as it is well within the abilities of one of skill in the art to provide a suitable driver. In addition to standard power conversion components (which can reduce or increase the input voltage to the desired forward voltage as well as provide dimming), components can be provided to sense ambient conditions, communicate with external devices (either wirelessly or via wires), control the operation of the LED assembly and any other desirable task that can be accomplished by the circuitry 308.

Figure 12:
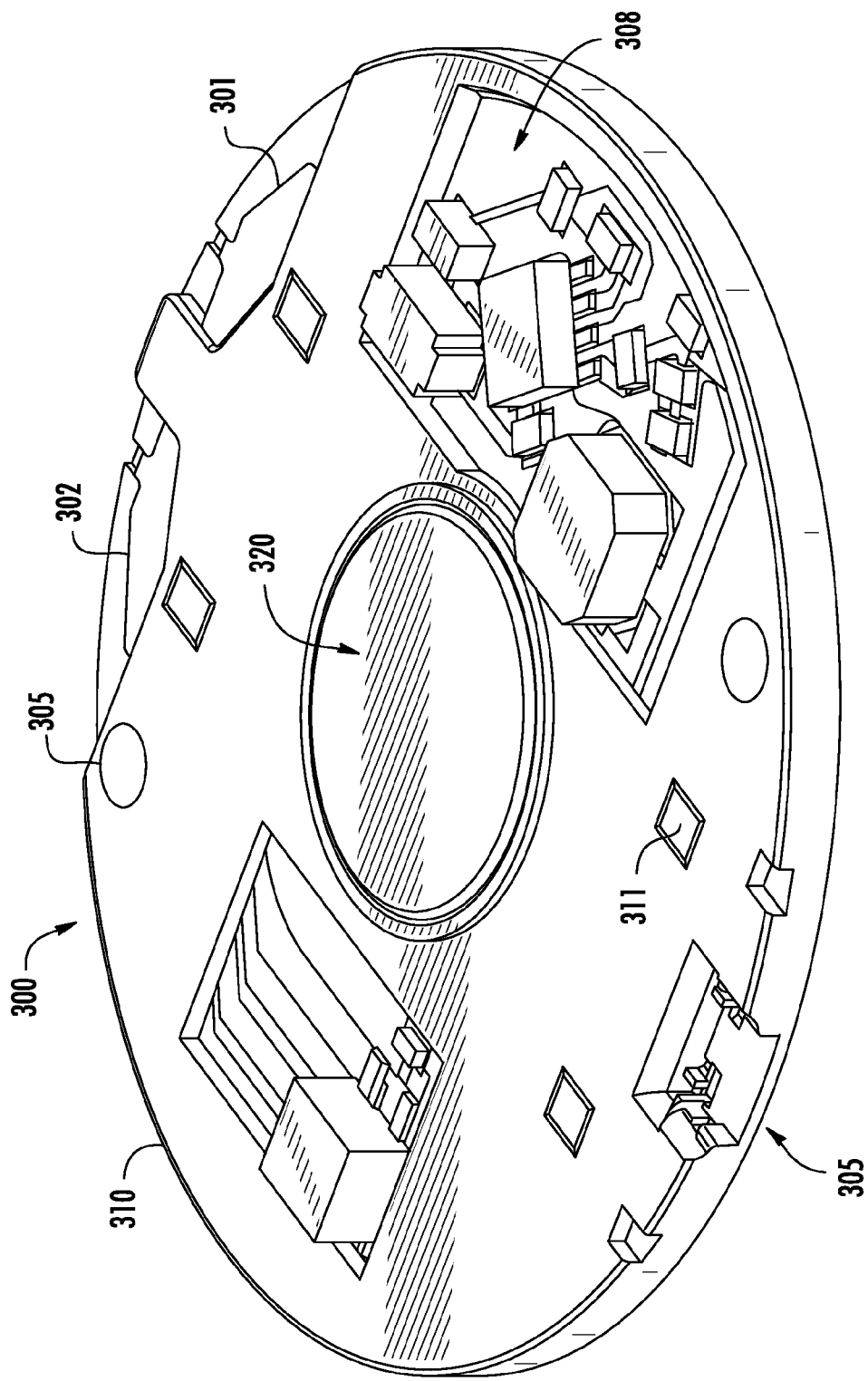
FIG. 12 illustrates a perspective view of another embodiment of an LED assembly.
Figure 13:
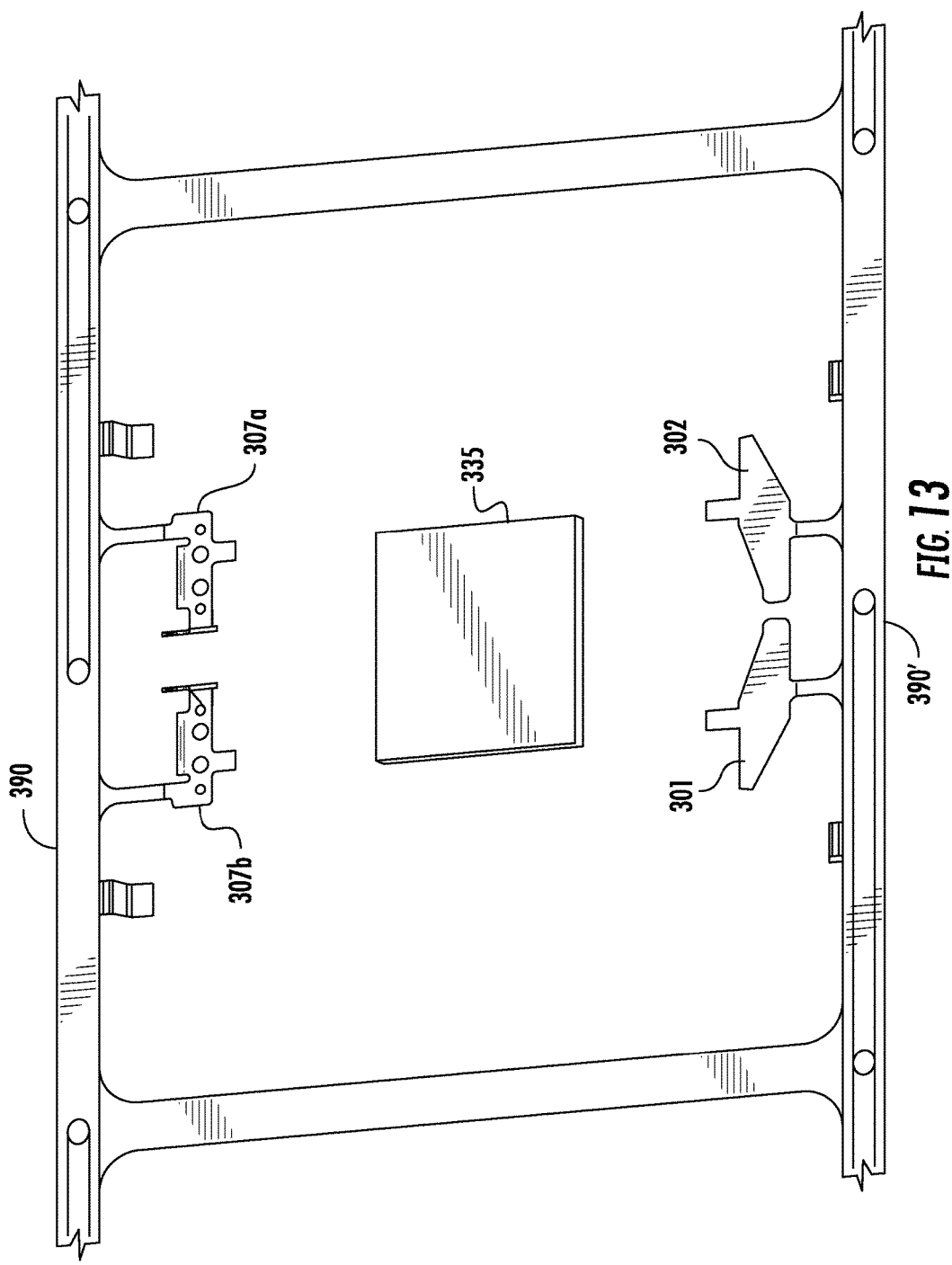
FIG. 13 illustrates an embodiment of a carrier configuration suitable for forming the LED assembly depicted in FIG. 12.
Figure 14:
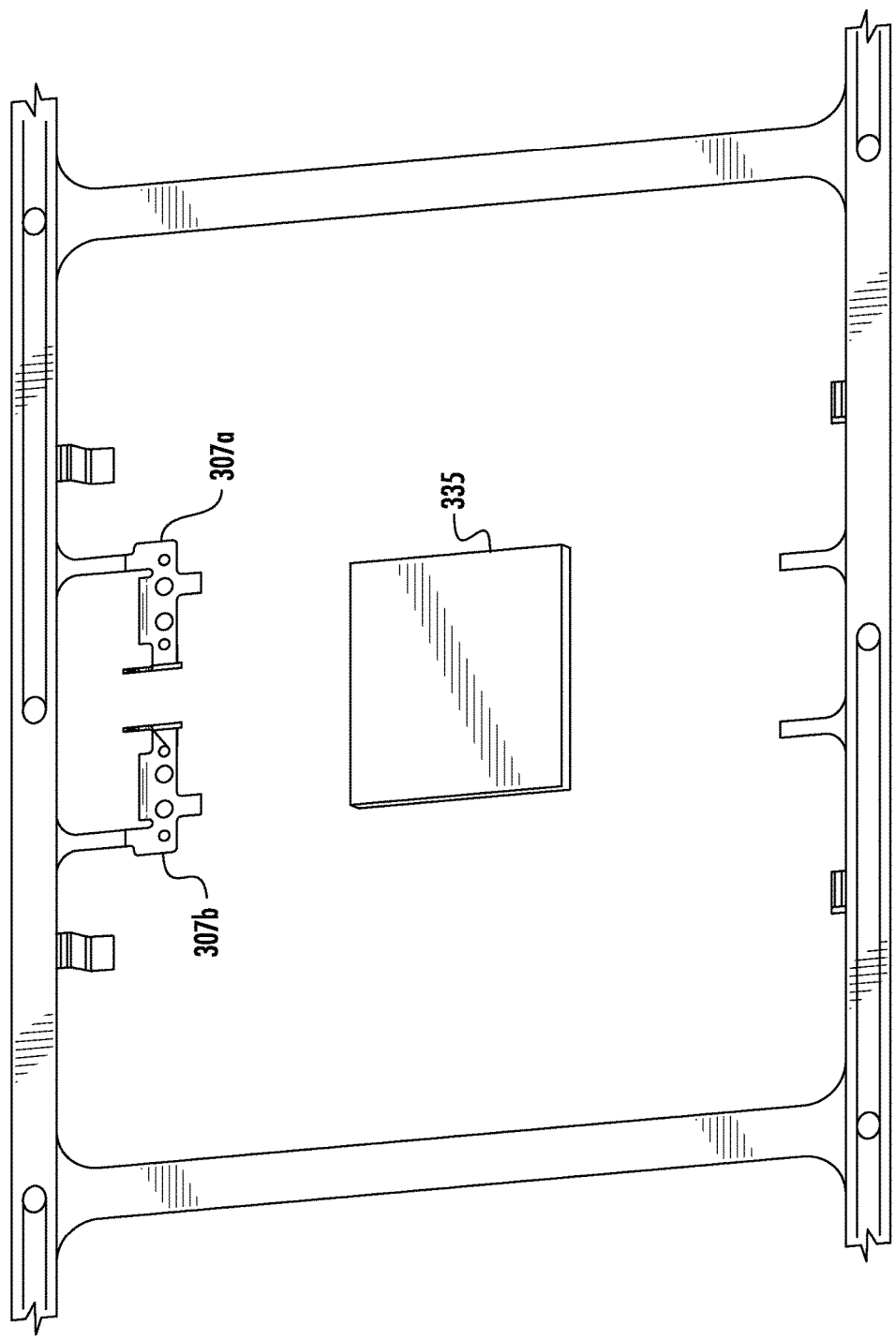
FIG. 14 illustrates another embodiment of a carrier configuration suitable for forming an LED assembly.
Figure 15:
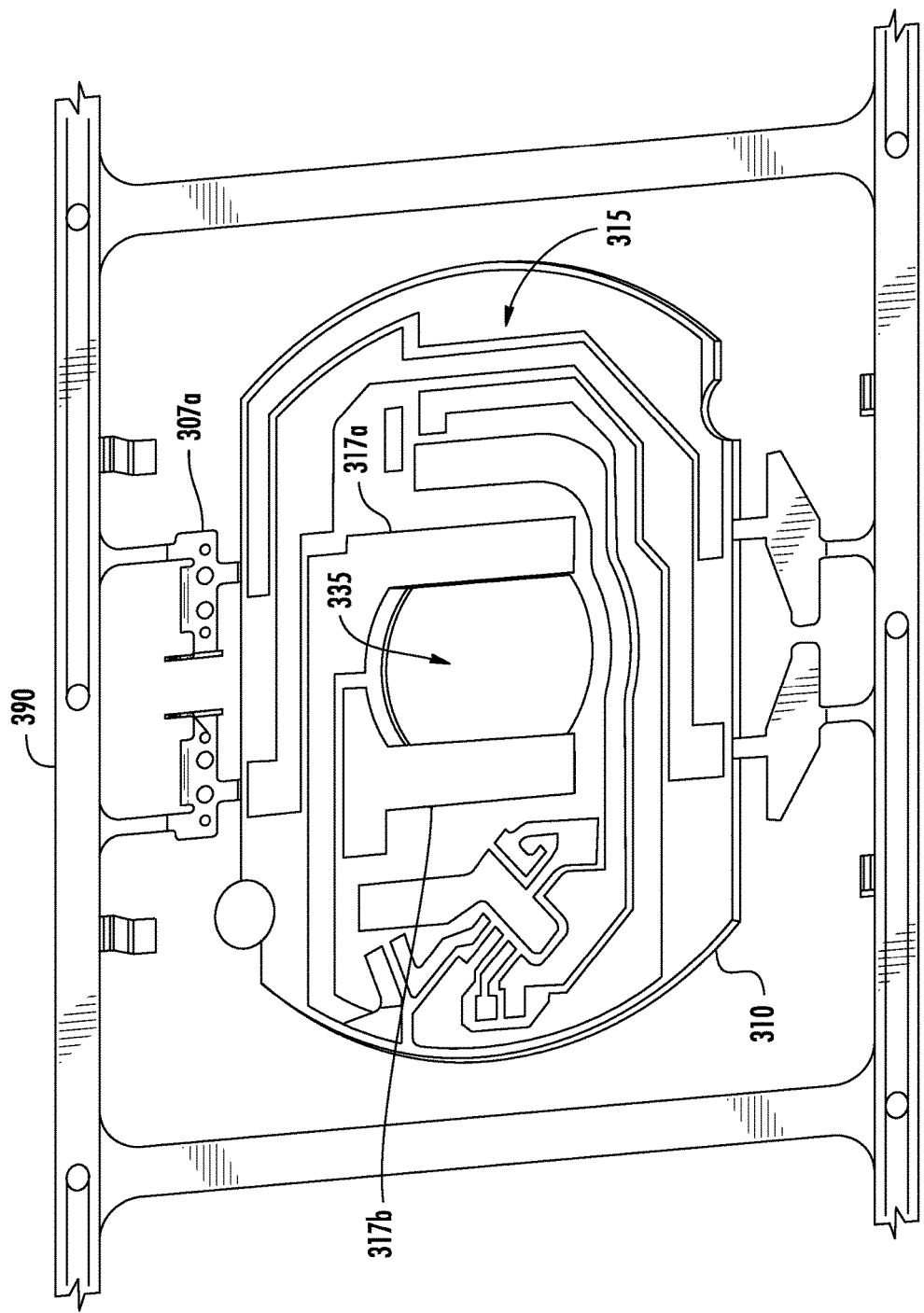
FIG. 15 illustrates a top view of an embodiment of a partially formed LED assembly.
Figure 16:
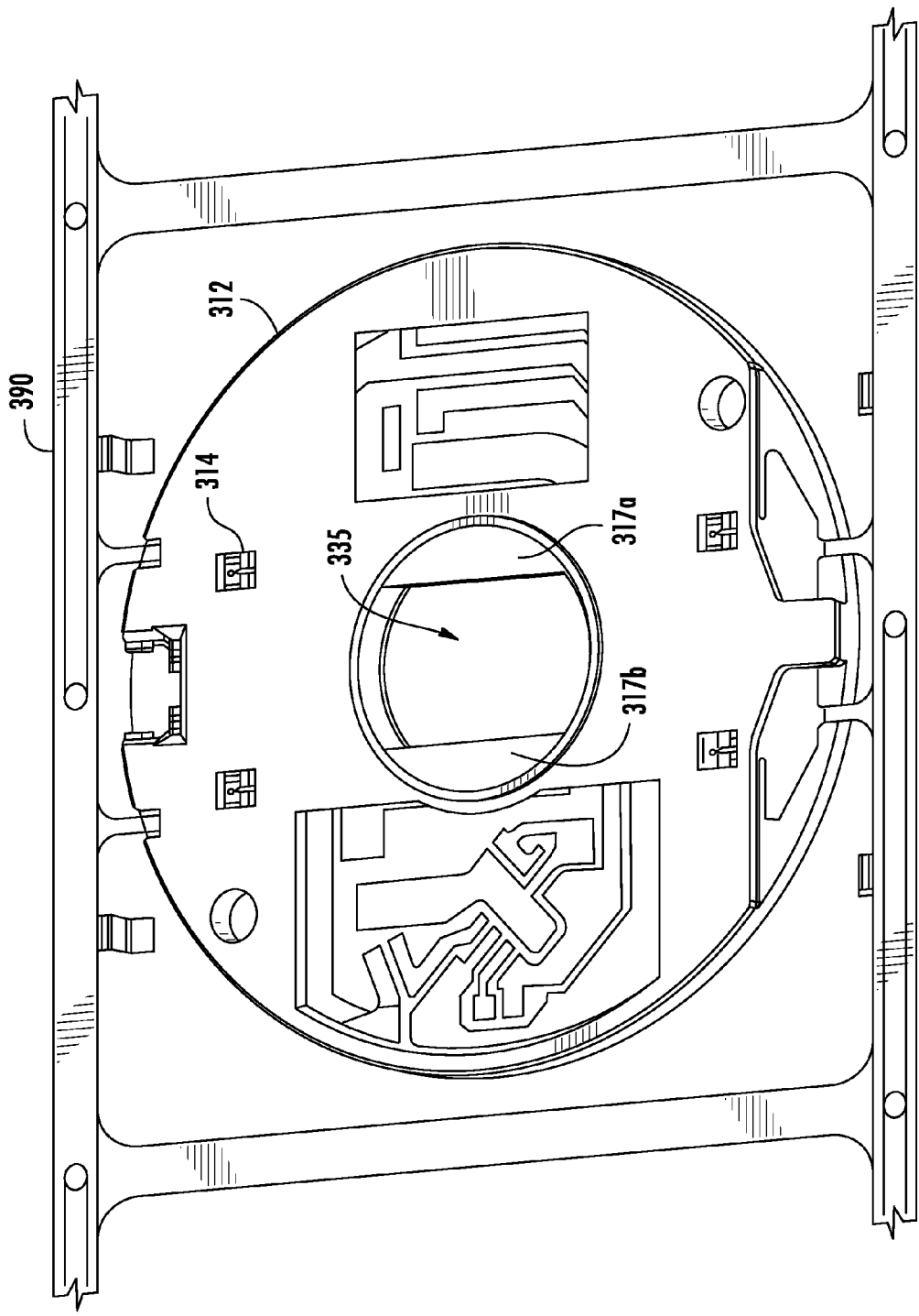
FIG. 16 illustrates a top view of the embodiment depicted in FIG. 15 with additional features added.
Figure 17:
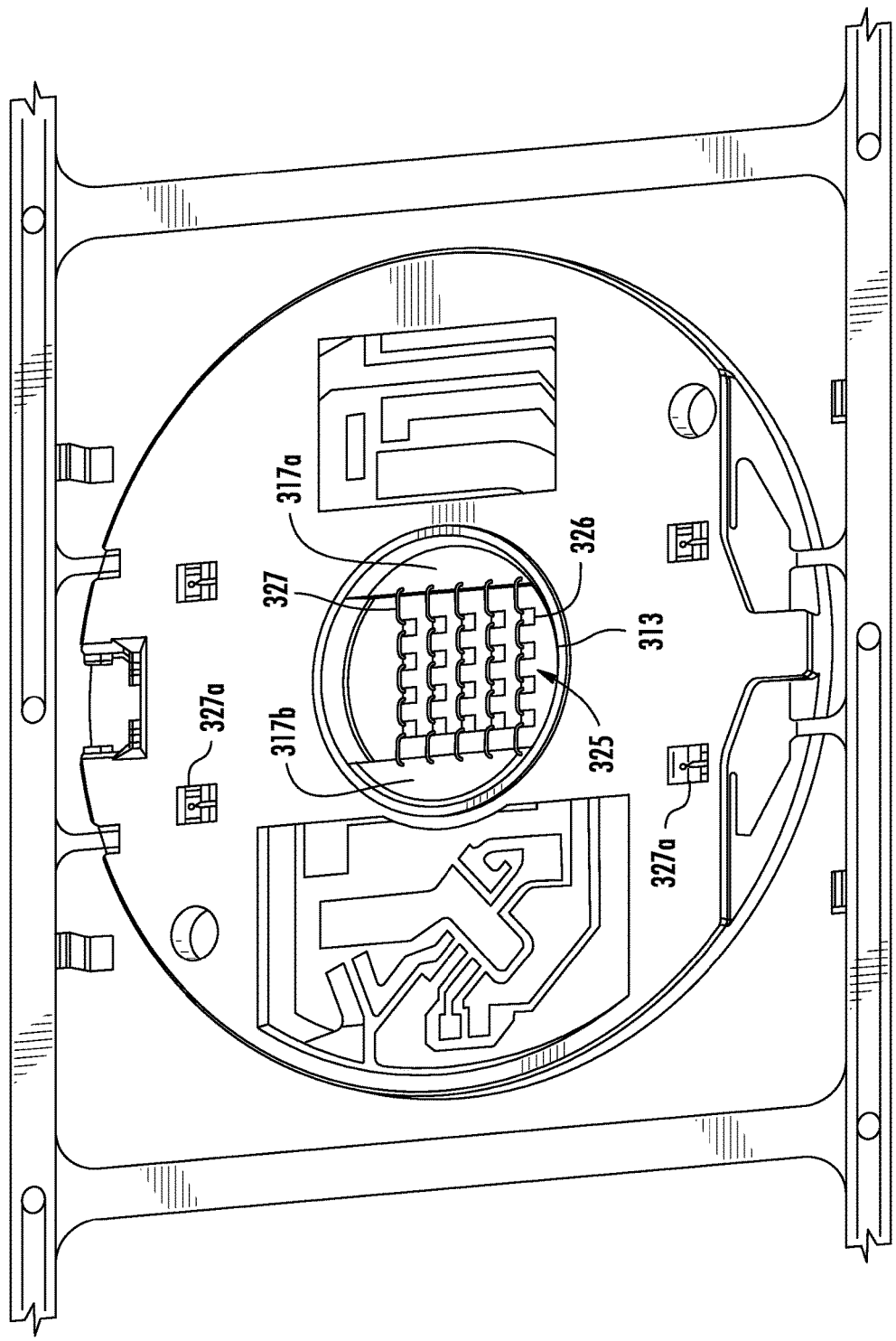
FIG. 17 illustrates a top view of the embodiment depicted in FIG. 16 with additional features added.
Figure 18:
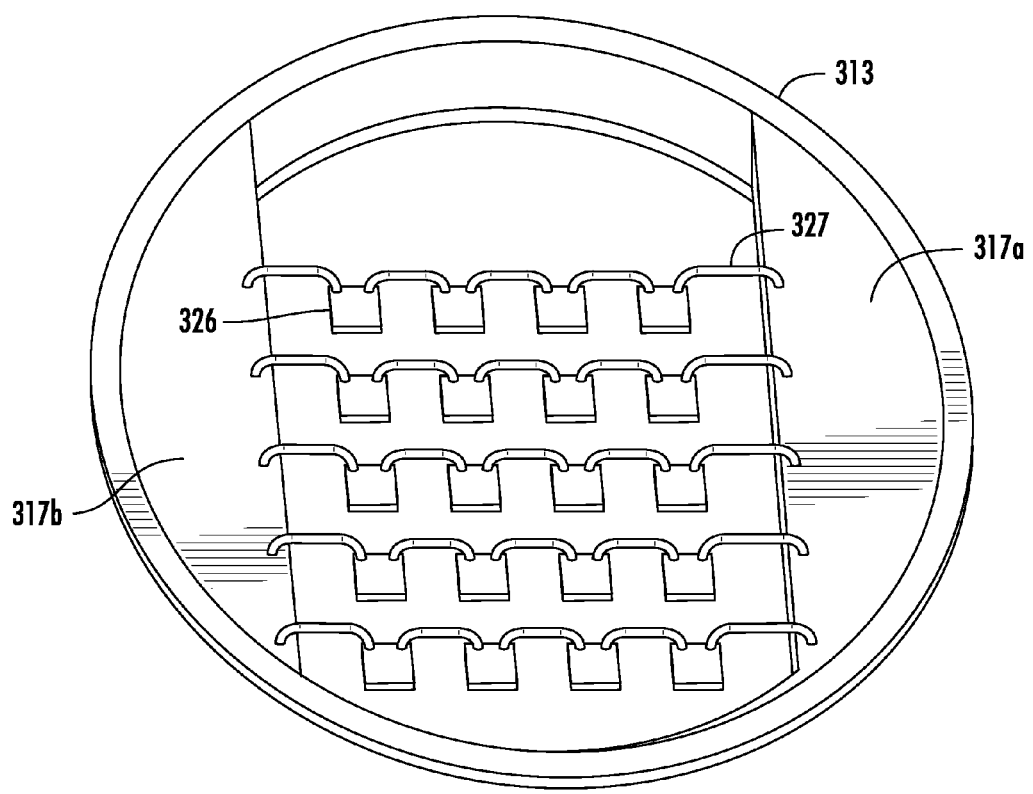
FIG. 18 illustrates an enlarged view of an embodiment of an LED array.
Figure 19:
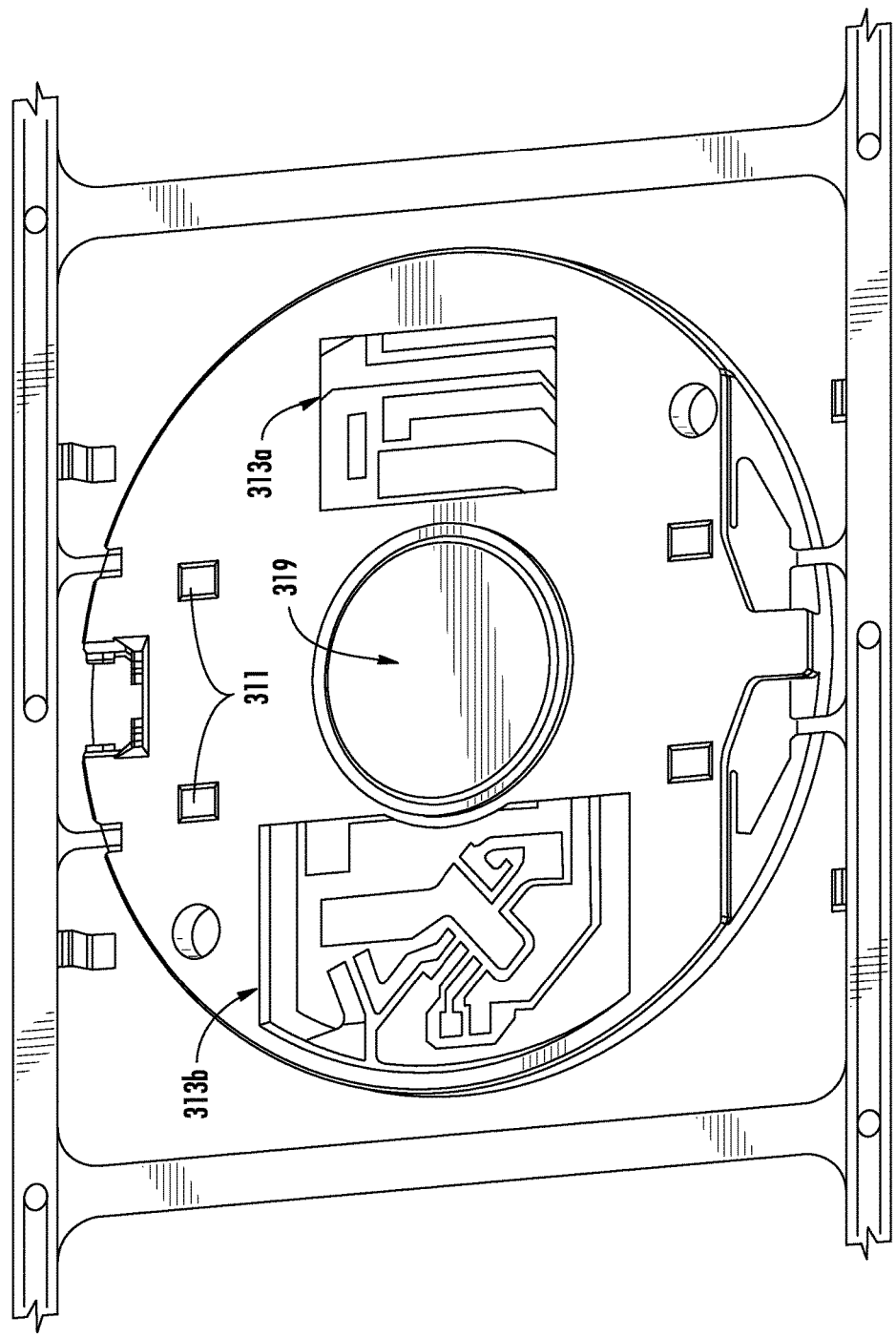
FIG. 19 illustrates a top view of the embodiment depicted in FIG. 17 with additional features added.
Figure 20:
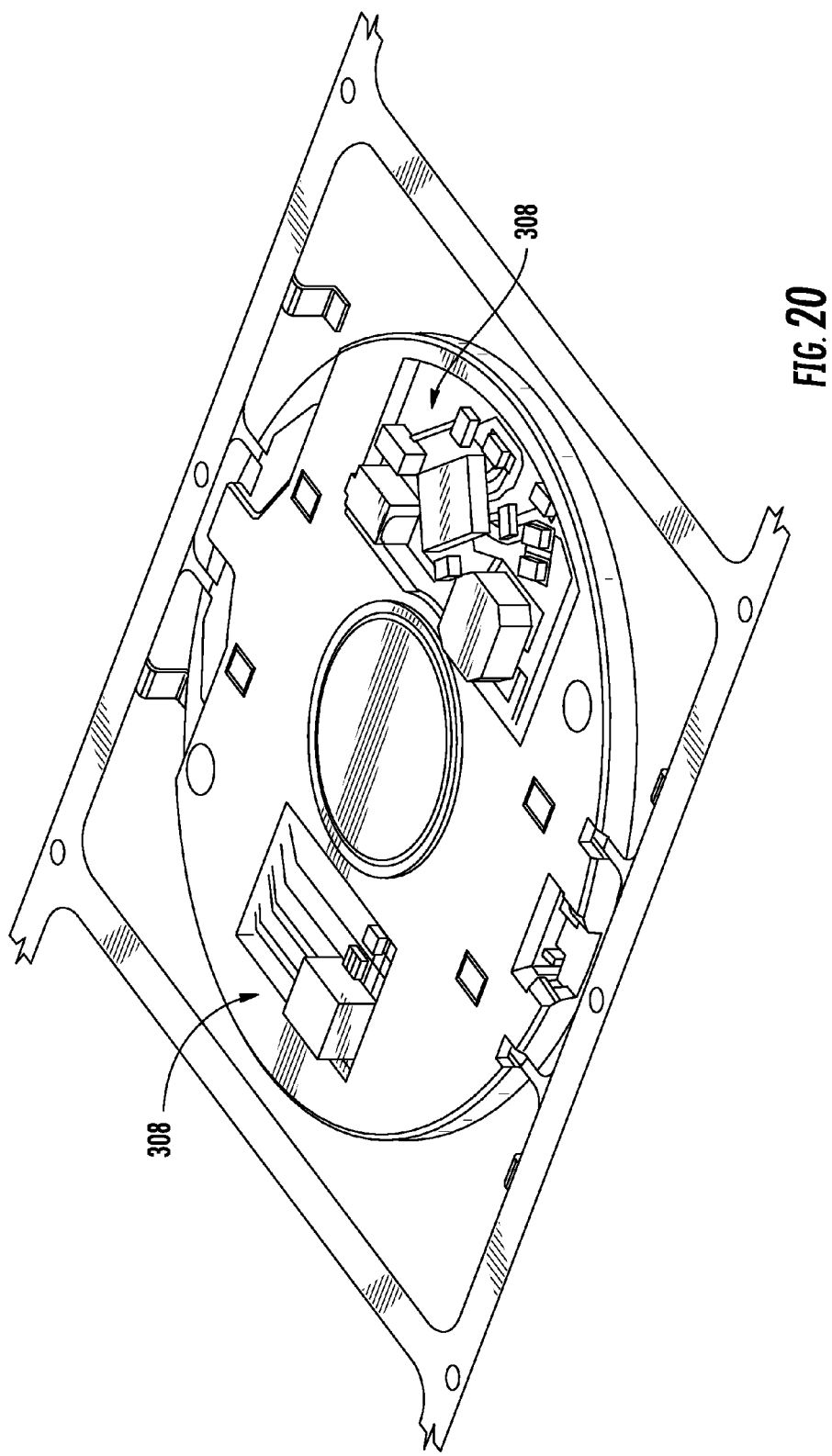
FIG. 20 illustrates a perspective view of the embodiment depicted in FIG. 19 with additional features added.
Figure 21:
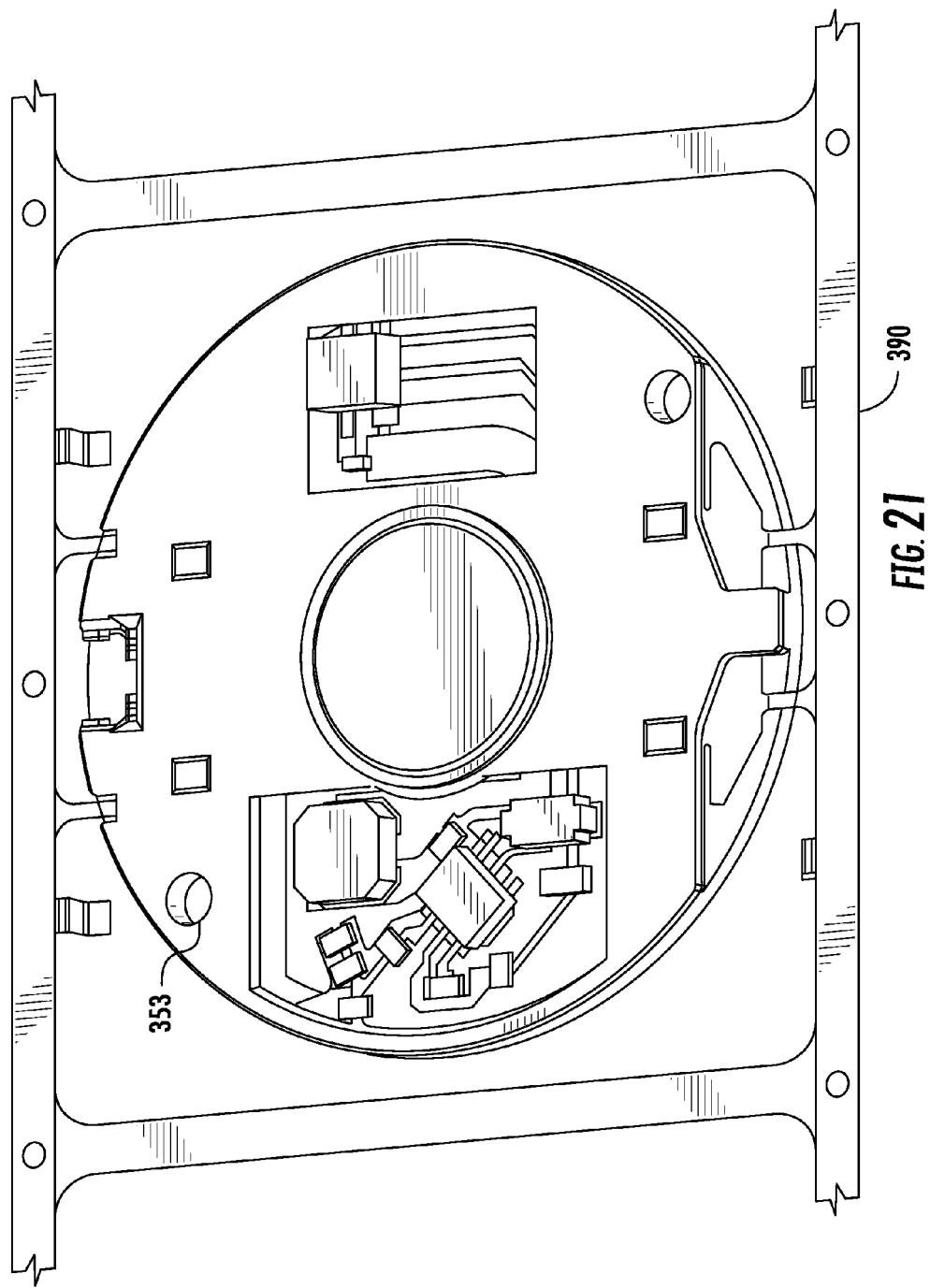
FIG. 21 illustrates a top view of the embodiment depicted in FIG. 20.
Figure 22:
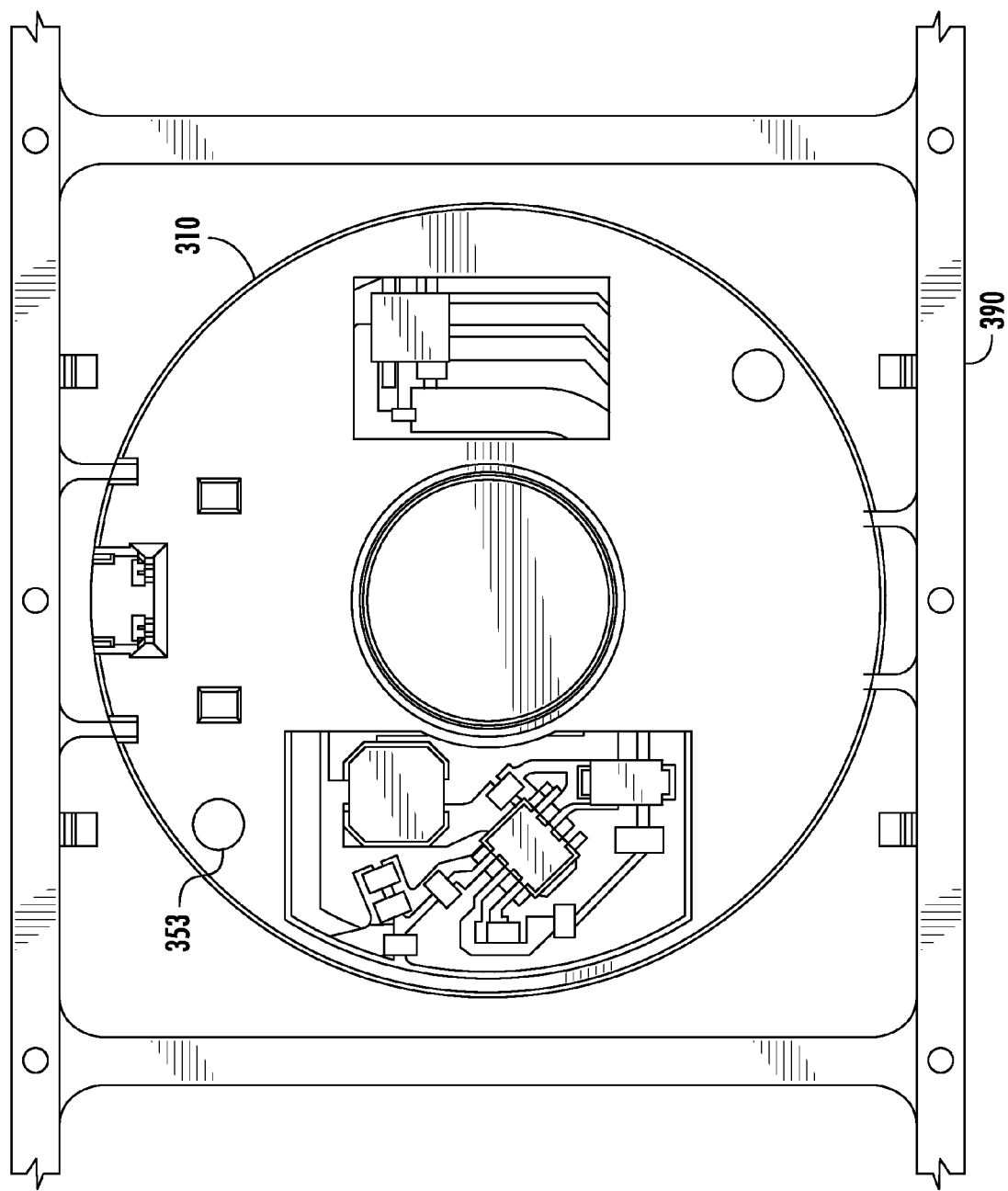
FIG. 22 illustrates a top view of an embodiment of an LED array formed with the carrier configured depicted in FIG. 14.
Figure 23:
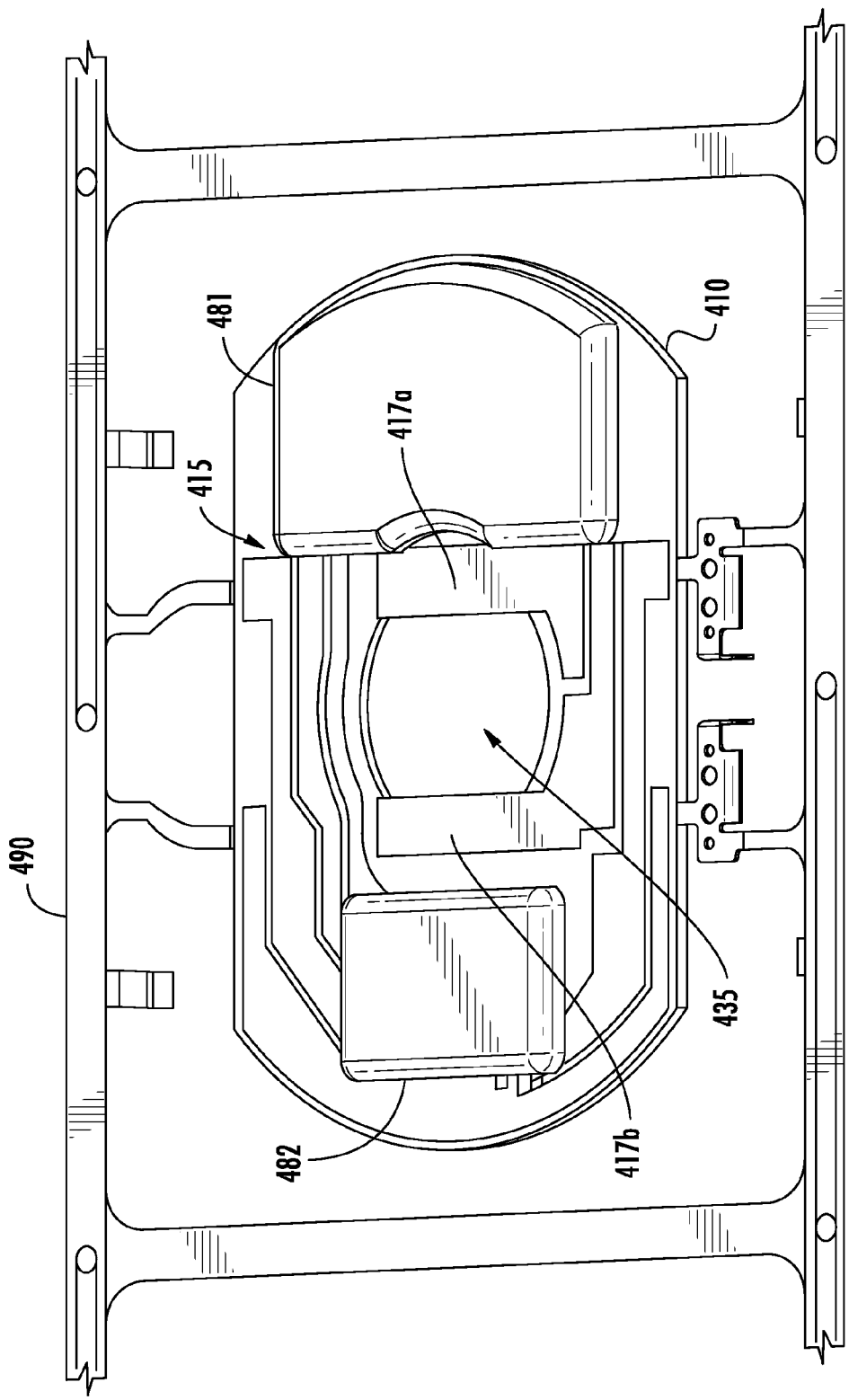
FIG. 23 illustrates a perspective view of another embodiment of an LED array that is partially formed.
Figure 24:
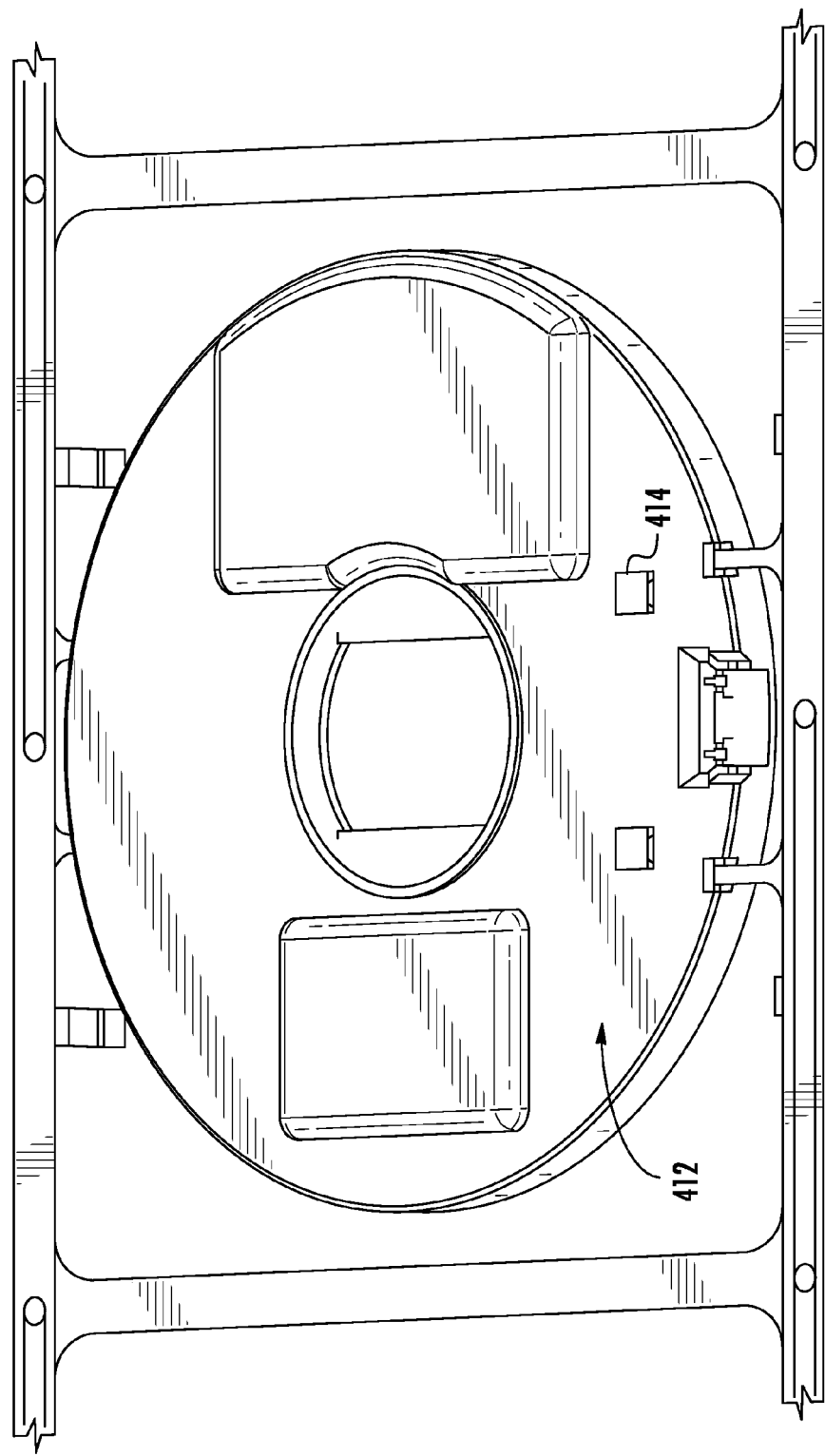
FIG. 24 illustrates a perspective view of the embodiment depicted in FIG. 23 with additional features added.
Figure 25:
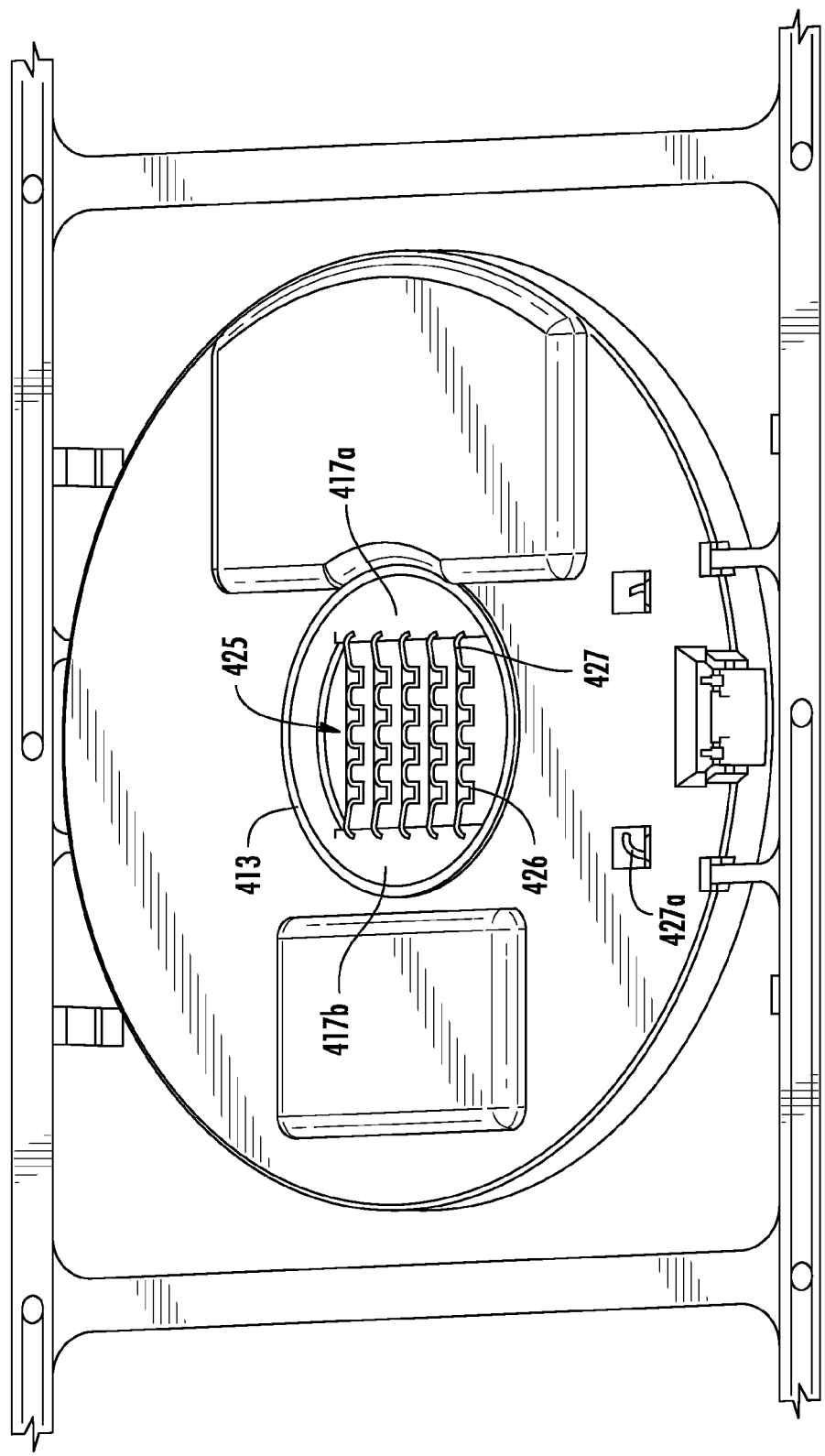
FIG. 25 illustrates a perspective view of the embodiment depicted in FIG. 24 with additional features added.
Figure 26:
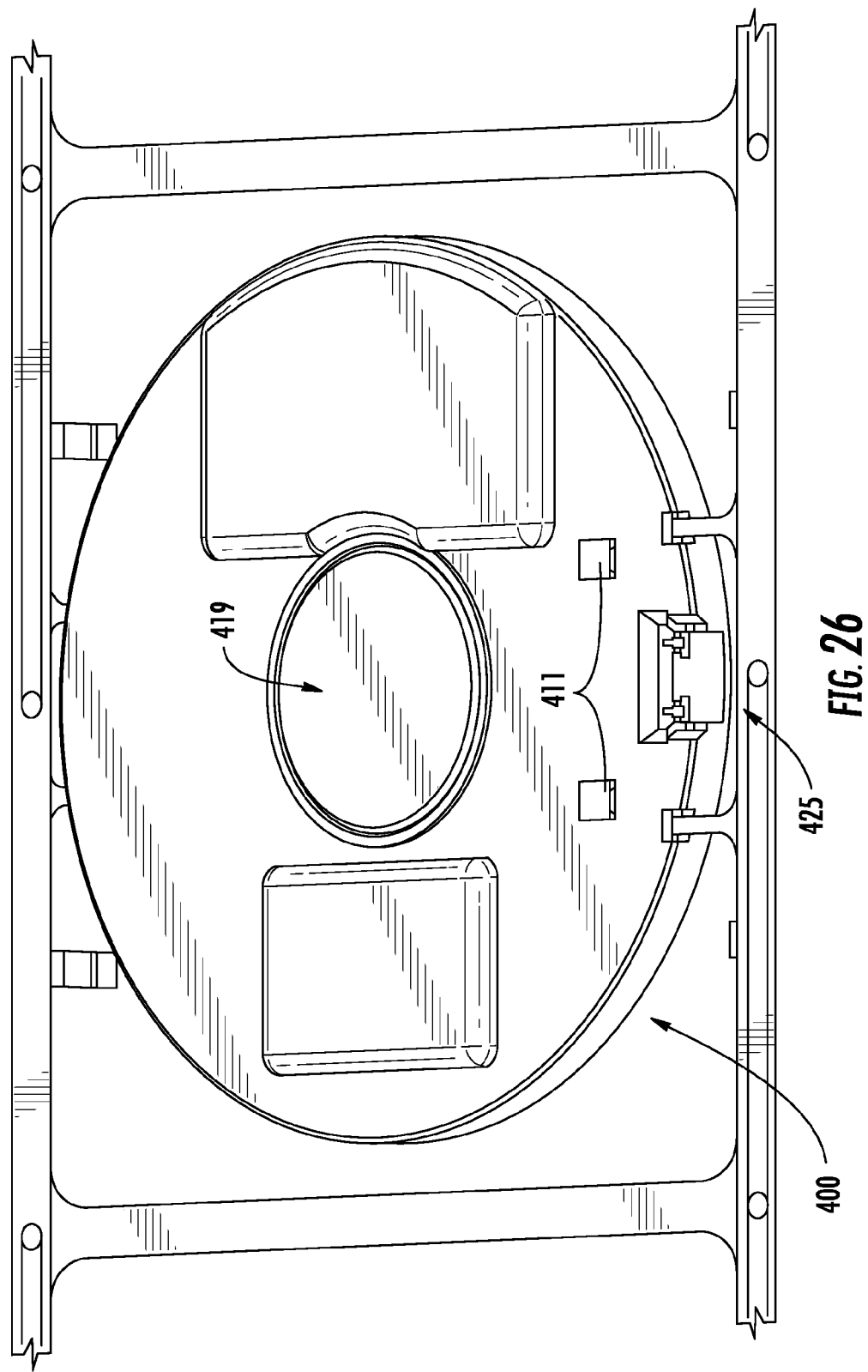
FIG. 26 illustrates a perspective view of the embodiment depicted in FIG. 25 with additional features added.
Figure 27:
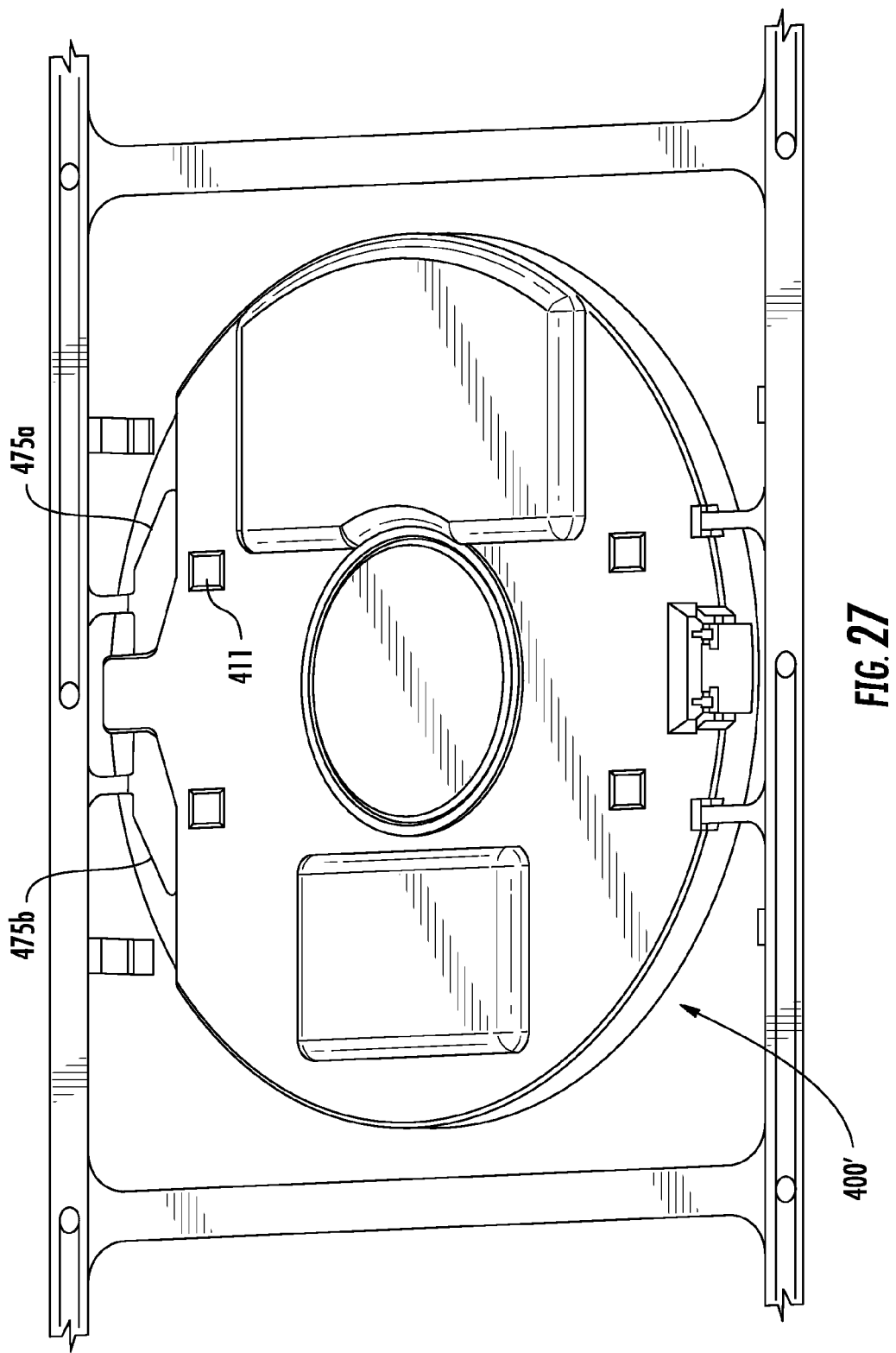
Figure 28:
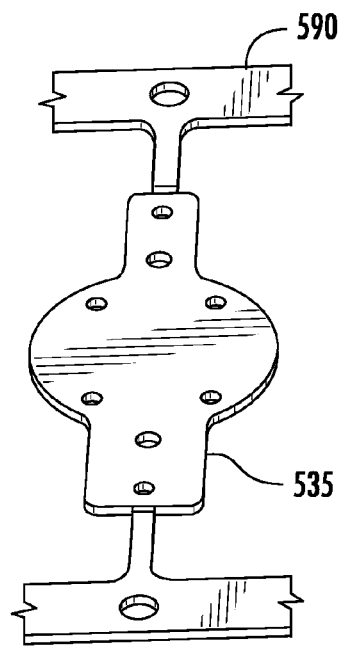
FIG. 28 illustrates a perspective view of another embodiment of a carrier configuration suitable to form an LED assembly.
Figure 29:
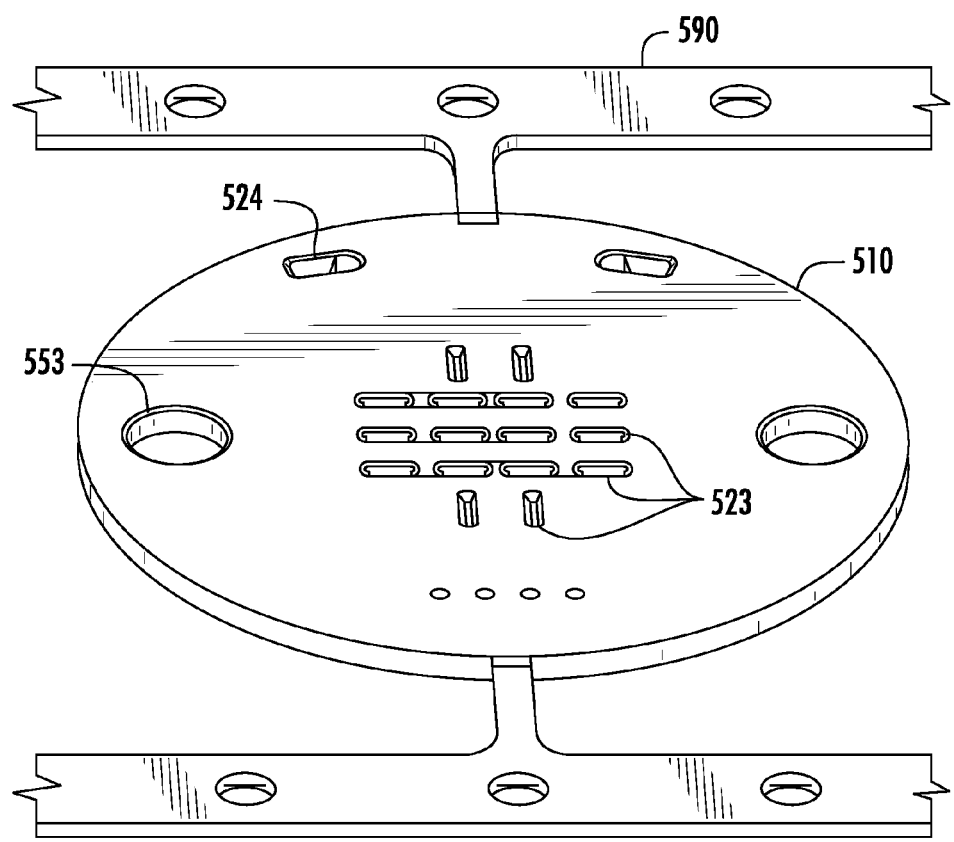
FIG. 29 illustrates a perspective view of the embodiment depicted in FIG. 28 with additional features added.
Figure 30:
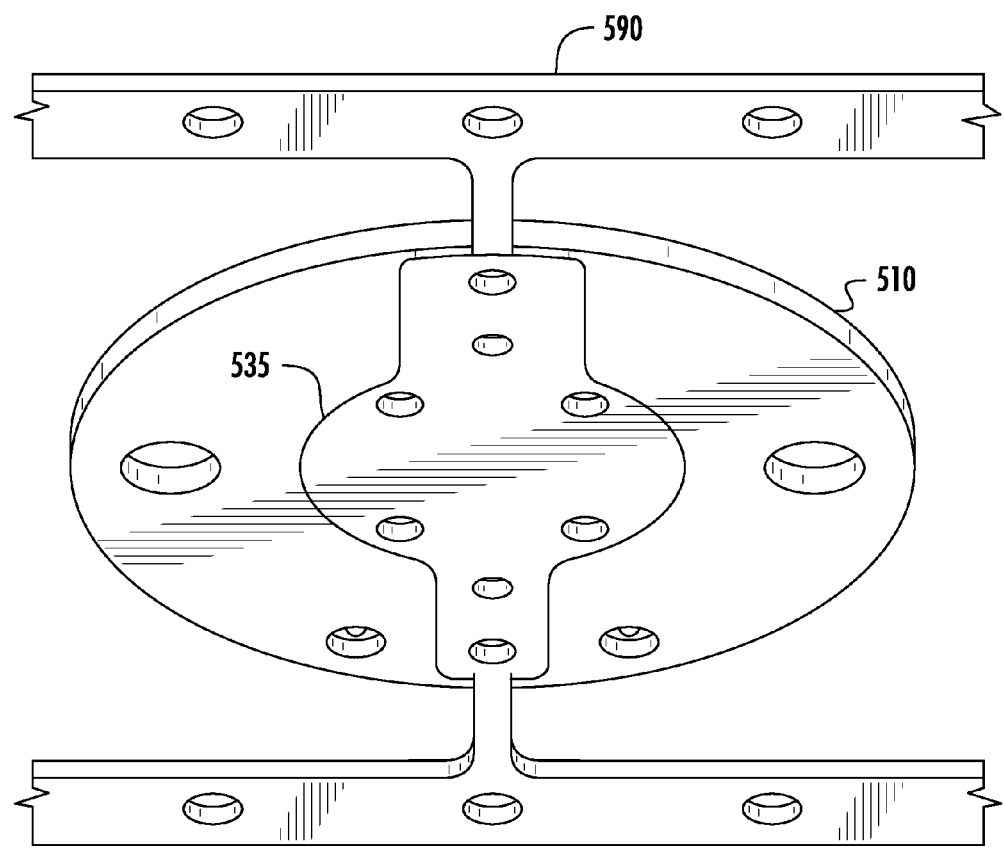
FIG. 30 illustrates another perspective view of the embodiment depicted in FIG. 29.
Figure 31:
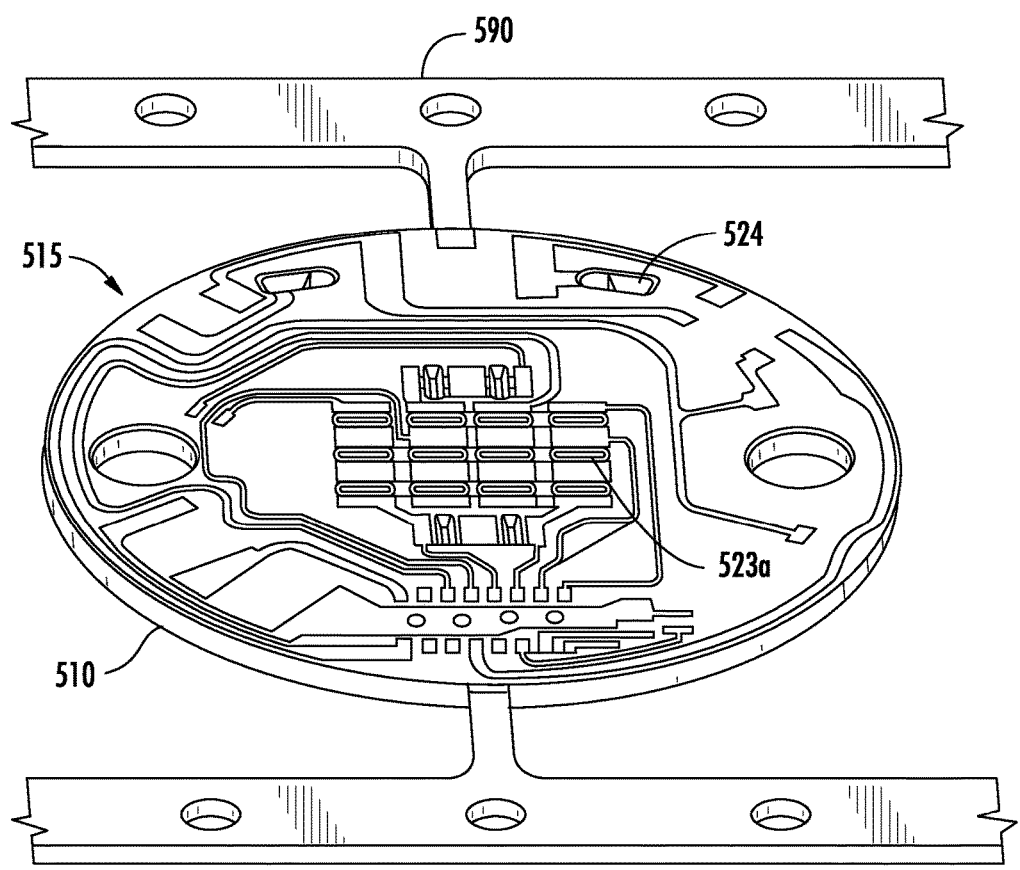
FIG. 31 illustrates a perspective view of the embodiment depicted in FIG. 29 with additional features added.
Figure 32:
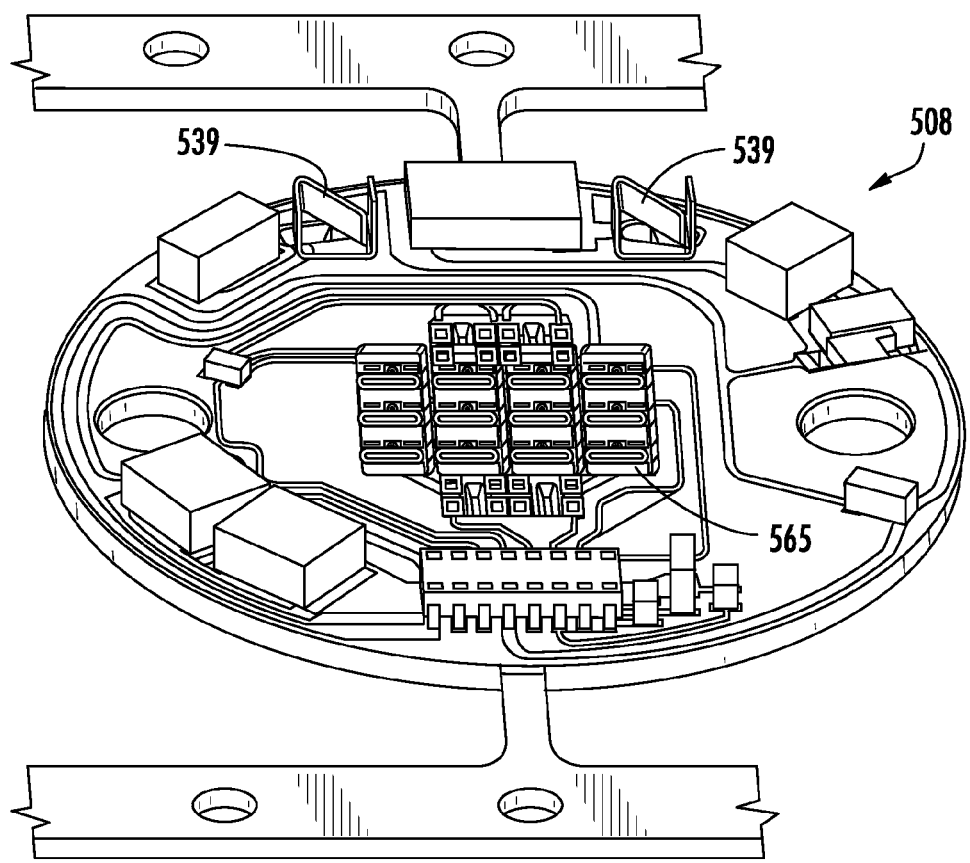
FIG. 32 illustrates a perspective view of the embodiment depicted in FIG. 31 with additional features added.
Figure 33:
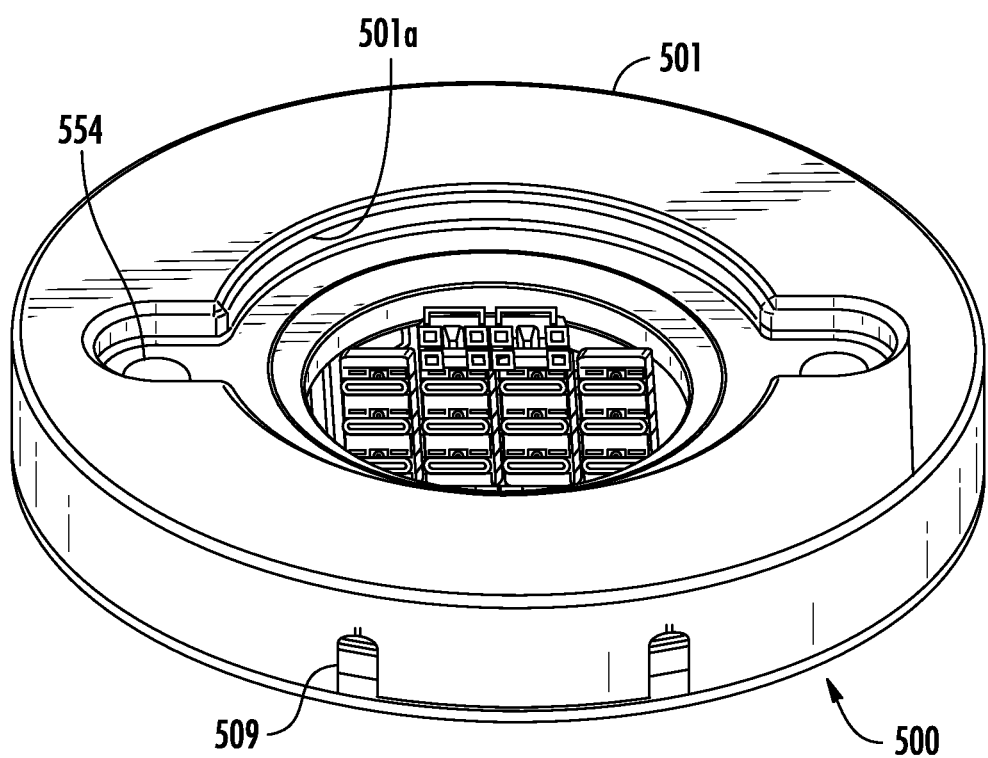
FIG. 33 illustrates a perspective view of an embodiment of an LED assembly based on the embodiment depicted in FIG. 32.

It should be noted that while the components are displayed as being unprotected in FIG. 12, the components could be covered as disclosed in FIG. 23 by covering the components with a resin or other desirable material such as a potting material or a silicon layer. An emission disk 320, which can be formed as discussed above, is provided and connection bonds are covered by pocket covers 311. As can be appreciated from FIGS. 13-22, the LED assembly 300 can also be formed by reel-to-reel process that has a carrier 390 with a strip 391' on both sides that positions and controls the position of the terminals 307a, 307b in the corresponding mold. A substrate 335 can be positioned into the mold with a pick-and-place operation and then a base 310 can be formed so as to provide a building block for an integrated LED assembly. As in the prior embodiments, solder pads 301, 302 can be included if desired but are not required and can be omitted if it is undesirable to solder to the LED assembly 300. While the substrate 335 is depicted as being separate, it could also be formed as part of the carrier 390 and thus carried into position the strips 390'. For example, the substrate can be provided by a plated copper alloy that is also used for the terminals and the terminals and the substrate can either have the same or a different plating on each. In an embodiment the substrate can beneficially receive a coating that creates a highly reflective surface.

In another embodiment the terminals can be supported by a first carrier and the substrate supported a second carrier and both can be positioned in the mold prior to filling the mold. If desired, the two carriers can also be married before the insert molding process is done. For example, a married carrier can have the first and second carriers crimped together and then the married carrier can be positioned in the mold to ensure the terminals and substrate are positioned in a desirable manner relative to each other. In such a construction the substrate can be formed of a different material compared to the terminals.

Thus, a number of alternative methods exist to provide an integrated assembly that includes the base, the terminals (which can be position in an integrated connector or provide the solder pads or both), and the substrate. Once the base is formed, a pattern 315 can be formed on the base 310 to provide electrical communication between the components that will eventually be placed on the base 310. The pattern 315 can provide an anode 317a and a cathode 317b on two sides of the substrate 335.

Once the pattern is formed, which can be done by using a known LDS and using an electroless plating process but also can be provided by any other suitable process for placing traces on an insulative surface, a second layer 312 is provided to cover the portions of the pattern 315 that are not needed to be directly connector to the components that form the circuitry 308. As can be appreciated, a ring 313 can be formed around the substrate 335 that helps form what effectively is similar to a recess and that ring 313 can be used to control the forming of an emission disk through the use of a slurry (as discussed above). Pockets 314 are provided in the second layer 312 so that a connection between the terminals and the pattern 315 can be formed.

An LED array 325 can then be positioned on the substrate in a desired pattern (any desirable pattern can be used) and wire bonds 327 can be used to connect the anode 317a and cathode 317b to chips 326 in the desired circuit arrangement. In addition, wire bonds 327a are used in the pockets 314 to connect the terminals to the pattern. Naturally, depending on the number of terminals and/or solder pads, the number of pockets and wire bonds can vary.

One the chips 326 are positioned on the substrate 335 and electrically connected with wire bonds 327, they can be covered with a silicon coat and an emission disk 319 (as discussed above). If the emission disk 319 is provided by dispensing a slurry into the base aperture then it may be desirable to have the assembly positioned in a chamber that allows for a desirable curing time. If the emission disk is a preformed component (such as a pre-molded phosphor disk) then the emission disk can be positioned and secured in a conventional operation (with an adhesive or an interference fit) that is suitable for high speed reel-to-reel operation (e.g., the need for dwell time can be substantially reduced or eliminated). Covers 311, which can be formed of silicon or other suitable insulative material, are placed in the pocket 314 and just circuit recesses, such as 313a, 313b are left. The circuit recesses allow a portion of the pattern 315 to remain exposed. Circuitry 308 is then placed in the recesses on the pattern 315 and can be secured to the pattern using a convention solder reflow process (preferably a lower temperature solder is used) or with a conductive epoxy. The circuitry 308 can then be covered with a low-pressure molding in a known manner.

As can be appreciated, apertures 305 can be included in the base to provide points of attachment. Alternatively the LED assemblies can be configured to be mounted into a system that clamps down on one or more surfaces and/or edges of the LED assembly. Thus a variety of configurations are possible with respect to the base 310. The base 310 can also include polarizing features to ensure the base is mounted in a desired orientation. Thus, the depicted circular shape is merely representative of one of a nearly infinite number of shape variations and is not intended to be limiting unless otherwise noted. For example, the LED assembly could be shaped so as to be comparable to a star package or a ZHAGA defined size.

Applicants have determined that a number of manufacturing processes can be used to form an LED assembly. For example, as depicted in FIGS. 13-21, the components that form the circuitry can be mounted to the pattern after the chips are positioned on the substrate and wire bonds are used to create desirable electrical connections. In an embodiment, a silicon layer is deposited over the chips and wire bonds and an emission disk (which can be formed by mounting a pre-formed phosphor disk and can also be formed by dispensing a phosphor slurry over the silicon layer) is mounted in the base aperture prior to the circuitry being added. Depending on the phosphor properties, the emission disk could also be formed after solder attach (although it is expected that a removable cover would be beneficial to cover the silicon layer during reflow operation).

In an alternative construction embodiment, as illustrated in FIGS. 23-26, the electronics could be solder attached to the sub-base 410 (the sub-base 410 could be an MID substrate formed with LDS and electroless plating as discussed above but could also be formed on a conventional PCB) and encapsulated with layers 481, 482, which can be formed of a low-pressure molding that would protect the electronics during subsequent molding operations but would not harm the circuitry during the molding process. The sub-base 410, terminals and the protected circuitry could then be insert-molded to into a base 412 in a conventional manner. The resulting base 412 could be configured with appropriate attachment features (such as polarizing features, edges and surfaces and attachment apertures as desired) and could include the depicted integrated connector. An LED array 425 could be positioned in recess 413 and the chips 426 could be connected to the anode 417a and cathode 417b via wire bonds 427 as discussed above. Wire bonds 427a could connect the terminals of the integrated connector to the pattern. Finally, an emission disk 419 and covers 411 would be provided. As can be appreciated, the LED assembly 400' could also include solder pads 475a, 475b if solder pads were desired to provide an electrical connection to the LED assembly. The benefit of the depicted construction is that the terminals can be adjusted (and reduced or expanded) as desired. Naturally, as discussed above, additional terminals can be added so that the electronics can receive signals via a separate set of terminals (although it is also possible to encode signals on the power lines if desired, as is well known in the art). Thus the additional terminals can provide additional power, control signals and/or communication signals. These additional terminals, if provided, can be soldered to traces on the MID so as to provide a reliable electrical connection.

It should be noted that while the depicted embodiment provides the circuitry on the same side as the LED array 425 for ease of illustration, it is also contemplated that that the circuitry could also be positioned on the opposite side of the base 412 as it has been determined that for many configurations it is feasible to rotate the carrier, solder attach components and the rotate the carrier back before applying chips (of course it is also possible to operate and place components in something other than a horizontal orientation but sometimes it is beneficial to avoid the possibility that gravity might cause a shift in the position of placed components). One advantage of having the solder attach on the opposite side is that it would avoid issues with the solder attach process inadvertently splashing solder on the substrate. However, having the circuitry and the LED array on the same side potentially allows for a thinner, more flat base 412 (at least the back side of the base) and thus may be desirable in certain applications.

It should be noted that MID substrate can also be used to provide an antenna. Thus an MID substrate could provide circuitry to connect the electronics and also provide an antenna that could be coupled to a transceiver, thus enabling an integrated wireless solution.

It should also be noted that while the integrated connector is depicted as being mateable on the same side as the LED are positioned, in an alternative embodiment the integrated connector could be formed on the opposite side (which would be beneficial for applications where power would be supplied from a first side of the base and light would be directed outward from a second side of the base, the second side different from the first side). Such a construction would be beneficial, for example and without limitation, in providing par 30 bulbs. In addition, while a simple base aperture is provided, an angled surface could also be provided in the base to help shape the emitted light. In addition, retention features could be added to the base to allow for attachment of a lens or other light-shaping structure such as reflectors. As can be further appreciated, the shape of the base could be modified as desired due to the flexibility offered by forming the base around the other components. Thus, substantial flexibility in the shape, functionality and size of the base is possible while still providing a low cost, high performance solution that can be process (if desired) either entirely or substantially in a reel to reel manufacturing process. Due to the potential for extend curing times that may be involved with using a dispensing process of the phosphor (which could be one or more layers of phosphors with different properties), it is expected that to provide a manufacturing process that is entirely reel to reel it would be beneficial to use a pre-formed phosphor disk.

Figure 34:
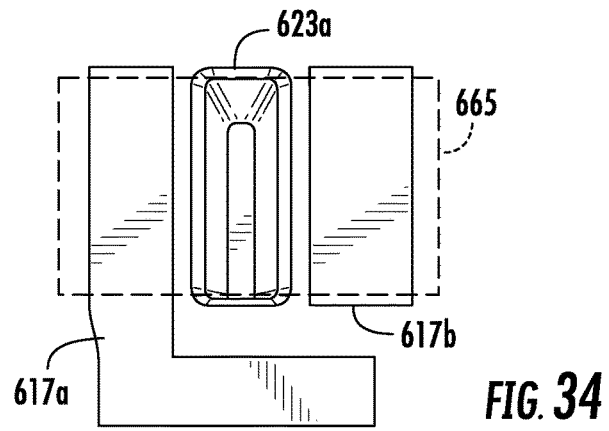
FIG. 34 illustrates an embodiment of a thermal via that can be used in an LED assembly.
Figure 35:
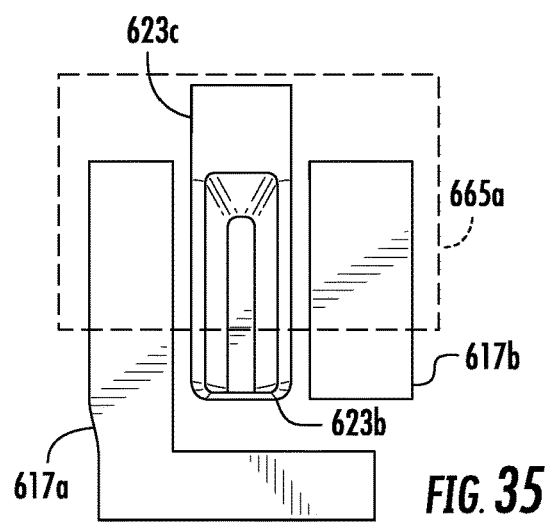
FIG. 35 illustrates another embodiment of a thermal via that can be used in an LED assembly.

FIGS. 28-33 illustrate another process by which an integrated LED assembly 500 can be formed. First a substrate 535 can be provided and the substrate can be provided on a carrier 590. As can be appreciated, the substrate 535 can be elongated in shape while providing an enlarged central area. A base 510 can be formed around the substrate 535 with the base 510 being made of an LDS compatible material. An aperture 553 can be formed in the base and a plurality of openings can be formed so that the openings are in communication with the substrate 535. A pattern of traces 515 can be formed on the base via convention LDS techniques (e.g., first a pattern is formed on the base with a laser, then the pattern is plated). The openings 523, once plated, become vias 523a that can conduct thermal energy to the substrate 535. Circuitry 508 can be positioned on the traces and solder attached to the base 510 and connectors such as wire trap 539, can also be mounted to the base 510 if desired. LED emitters 565 can be mounted to the base 510 at the same time as the electronic components are and the LED emitters 565 can be mounted directly on or adjacent to thermal vias that extend from a first side of the base to the substrate (as depicted in FIGS. 34-35). The thermal vias direct thermal energy to the substrate, which then can distribute the thermal energy to a heat sink in a convention manner. A cover 501 is then provided with one or more light openings 501a that allow light from the LED emitters to be directed from the LED assembly 500. The light opening(s) 501a can be shaped to direct the light in a pattern if desired. Connection openings 509 can be aligned with the wire trap 539 so that wires can be inserted into the wire trap 539 and an electrical connection made and power can be supplied to the LED assembly 500.

As can be appreciated from FIG. 34, in an embodiment an emitter 665 (shown in broken line) can be mounted so that it is directly attached to anode 617a and cathode 671b and is positioned over via 623a. The emitter 665 makes contact with the edges of the via 623a and this allows the via to conduct heat away from the emitter. In another embodiment, emitter 665a is mounted directly to anode 617a and cathode 671b and is partially positioned over trace 623c (which is connected to via 623b) and partially is positioned over via 623b. The trace 623c and the edges of the via 623b help conduct thermal energy away from the emitter.

Figure 36:
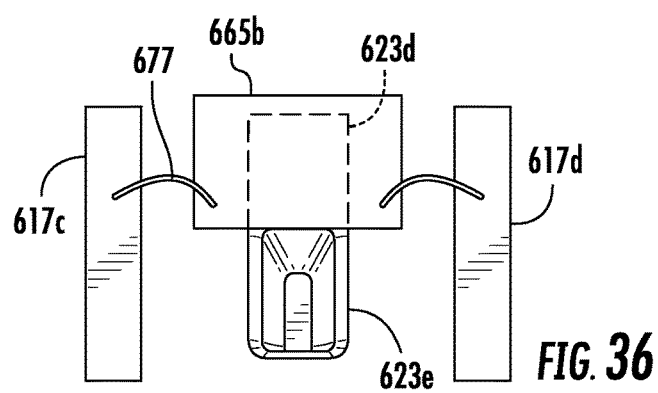
FIG. 36 illustrates another embodiment of a thermal via that can be used in an LED assembly.

If COB style chips are used, then chip 665b can be positioned on a trace 623d which is coupled to vias 623e (as is depicted in FIG. 36). Power is provided to the chip 665b by connecting anode 617c and cathode 617d with wire bond 677. A chip could also be mounted directly on a via in the base (similar to how emitters are mounted on the via) and the edges of the via could act to conduct thermal energy away from the chip.

Figure 37:
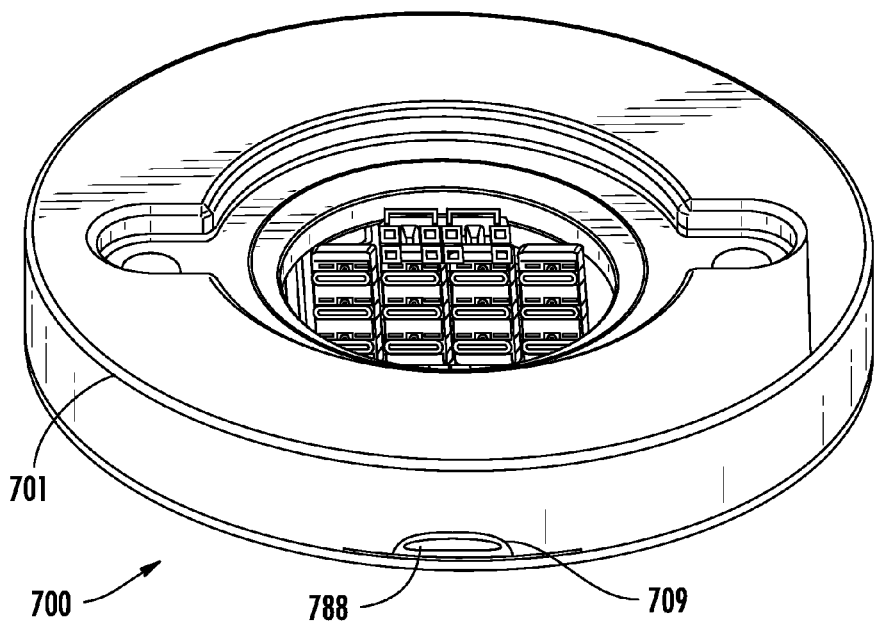
FIG. 37 illustrates a perspective view of an embodiment of a LED assembly with a connector plug.
Figure 38:
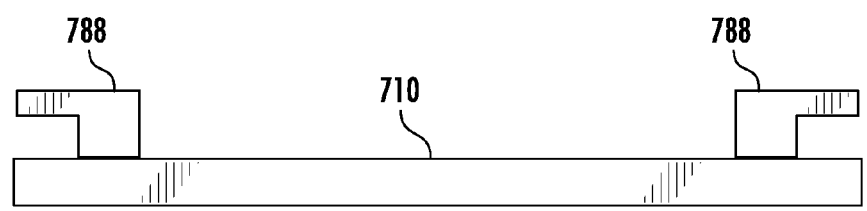
FIG. 38 illustrates a schematic representation of a base and two connectors that can be used in the LED assembly disclosed FIG. 37.

FIGS. 37 and 38 illustrate another embodiment of an LED assembly 700 with a cover 701. While the LED assembly 700 can substantially similar and construction to the design depicted in FIG. 33, the wire trap is replaced with a connector 788 that can be accessed via opening 709 in the cover 701. If desired, the LED assembly 700 could have two connectors 788 mounted on a base 710, such as is depicted in FIG. 38. Such a construction would allow a daisy-chain of two or more LED assemblies, assuming the traces could handle the power requirements. Thus, a number of different alternatives are possible, depending on the electrical connection (of which the connector and the wire traps are examples of) to the LED assembly.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

We claim:
1. An LED assembly, comprising:
a plurality of terminals, the terminals are integrally formed to a carrier;
a substrate;
a base, the base insert molded about at least a portion of the plurality of terminals, carrier and the substrate; and a plurality of LED chips positioned on the substrate and electrically coupled to the plurality of terminals.

2. The LED assembly of claim 1, wherein the plurality of terminals have contacts positioned in a recess in the base, the contact and the recess providing an integrated connector.

3. The LED assembly of claim 1, further comprising circuitry electrically connected to at least one of the plurality of terminals, the circuitry configured to control a lumen output of the plurality of LED chips.

4. The LED assembly of claim 3, wherein a pattern is deposited on the base that interconnects the circuitry.

5. The LED assembly of claim 1, wherein the LED assembly is disposed on a reel.

6. The LED assembly of claim 1, wherein a bridge connects a pair of terminals.

7. The LED assembly of claim 1, wherein the base supports the terminals that define a portion of a connector formed in the base.

8. The LED assembly of claim 1 wherein the base has a first layer and a second layer.

9. An LED assembly, comprising:
a plurality of terminals, the terminals are integrally formed to a carrier;
a substrate;
a base, the base insert molded about a portion of the terminals, carrier and the substrate;
an electrical connection in the base between the terminals and the substrate; and
an LED array provided on the substrate, the LED array configured to receive power through the electrical connection.

10. The LED assembly of claim 9, wherein the electrical connection is a connector formed in the base, the electrical connection including at least two terminals that are electrically connected to the LED array.

11. The LED assembly of claim 9, further comprising circuitry electrically coupled to the electrical connection, the circuitry configured to control a lumen output of the plurality of LED array.

12. The LED assembly of claim 11, wherein a pattern is deposited on the base that interconnects the circuitry.

13. The LED assembly of claim 9, wherein the carrier is configured to be removed from the terminals.

14. The LED assembly of claim 9, wherein a bridge connects a pair of terminals.

15. The LED assembly of claim 9, wherein the substrate is formed with a carrier.

* * * * *